US012562715B2

(12) United States Patent
Goto et al.

(10) Patent No.: US 12,562,715 B2
(45) Date of Patent: Feb. 24, 2026

(54) SMALL SIZED ACOUSTIC WAVE DEVICE WITH PARTIALLY DIFFERENT INTERDIGITAL TRANSDUCER ELECTRODE THICKNESSES

(71) Applicant: SKYWORKS SOLUTIONS, INC., Irvine, CA (US)

(72) Inventors: Rei Goto, Osaka (JP); Shoji Okamoto, Hirakata (JP); Hironori Fukuhara, Ibaraki (JP)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 239 days.

(21) Appl. No.: 18/195,423

(22) Filed: May 10, 2023

(65) Prior Publication Data

US 2023/0378937 A1 Nov. 23, 2023

Related U.S. Application Data

(60) Provisional application No. 63/365,074, filed on May 20, 2022.

(51) Int. Cl.
*H03H 9/72* (2006.01)
*H03H 9/02* (2006.01)
*H03H 9/64* (2006.01)

(52) U.S. Cl.
CPC ........ *H03H 9/725* (2013.01); *H03H 9/02661* (2013.01); *H03H 9/6483* (2013.01); *H03H 9/6489* (2013.01)

(58) Field of Classification Search
CPC ...... H03H 9/725; H03H 9/02661; H03H 9/64; H03H 9/02535; H03H 9/6483; H03H 9/6489
USPC .......................................... 333/193
See application file for complete search history.

(56) References Cited

U.S. PATENT DOCUMENTS

| | | | | |
|---|---|---|---|---|
| 10,084,427 B2 * | 9/2018 | Solal | ................. | H03H 9/02551 |
| 2018/0316333 A1 * | 11/2018 | Nakamura | ............... | H03H 9/54 |
| 2019/0393861 A1 * | 12/2019 | Nosaka | ................. | H03H 9/72 |
| 2023/0016884 A1 | 1/2023 | Goto et al. | | |
| 2023/0163748 A1 | 5/2023 | Goto et al. | | |
| 2023/0223910 A1 | 7/2023 | Goto et al. | | |
| 2023/0223917 A1 | 7/2023 | Goto et al. | | |
| 2023/0336152 A1 | 10/2023 | Goto et al. | | |
| 2023/0336153 A1 | 10/2023 | Goto et al. | | |
| 2023/0361755 A1 | 11/2023 | Goto | | |

* cited by examiner

*Primary Examiner* — Andrea Lindgren Baltzell
*Assistant Examiner* — Abigail Amir Yaldo
(74) *Attorney, Agent, or Firm* — Lando & Anastasi, LLP

(57) ABSTRACT

A radio frequency multiplexer comprises a piezoelectric substrate, a first surface acoustic wave resonator including interdigital transducer electrodes disposed on the piezoelectric substrate and having a first metal layer formed of a first metal and a second metal layer disposed on the first metal layer and formed of a second metal having a higher density than the first metal, and a second surface acoustic wave resonator including interdigital transducer electrodes disposed on the piezoelectric substrate and having a first metal layer formed of the first metal, but lacking the second metal layer.

18 Claims, 30 Drawing Sheets

TCSAW

DMS

RESONATOR

PROTECTION LAYER (SiN, SiON)

SiO2

Al

Mo

IDT METAL
LAYERS

LV−TCSAW

SIMULATED TRANSMISSION CHARACTERISTICS

SCHEMATIC OF 3IDT DMS

LV—MPS

REFLECTOR GRATING

IDT ELECTRODES

REFLECTOR GRATING

LV–SAW FOR
REFLECTOR GRATINGS

LV-SAW FOR IDT
ELECTRODES

HIGH DENSITY
MATERIAL STRIP $SiO_2$

LN

THICKENED ELECTRODE
FINGER TIP

SiO$_2$

LN

ACTIVE REGION: HIGH MASS LOADING IDT
OTHER REGIONS: LOW MASS LOADING IDT
GIVES IMPROVED ACOUSTIC ENERGY CONFINEMENT

IDT

PIEZO

SiO₂

HAMMERHEAD

THICKENED
DIELECTRIC

THICKENED
DIELECTRIC

SMALL SIZED ACOUSTIC WAVE DEVICE WITH PARTIALLY DIFFERENT INTERDIGITAL TRANSDUCER ELECTRODE THICKNESSES

CROSS-REFERENCE TO RELATED APPLICATIONS

This application claims priority under 35 U.S.C. § 119(e) to U.S. Provisional Patent Application Ser. No. 63/365,074, titled "SMALL SIZED ACOUSTIC WAVE DEVICE WITH PARTIALLY DIFFERENT INTERDIGITAL TRANS-DUCER ELECTRODE THICKNESSES," filed May 20, 2022, the entire content of which is incorporated herein by reference in its entirety for all purposes.

BACKGROUND

Technical Field

Embodiments of this disclosure relate to acoustic wave filters, and more specifically acoustic wave filters including surface acoustic wave resonators with different interdigital transducer electrode structures disposed on the same die.

Description of Related Technology

Acoustic wave devices, for example, surface acoustic wave (SAW) devices may be utilized as components of filters in radio frequency electronic systems. For instance, filters in a radio frequency front end of a mobile telephone can include acoustic wave filters. Two acoustic wave filters can be arranged as a duplexer or a diplexer.

SUMMARY

In accordance with one aspect, there is provided a radio frequency multiplexer. The multiplexer comprises a piezo-electric substrate, a first surface acoustic wave resonator including interdigital transducer electrodes disposed on the piezoelectric substrate and having a first metal layer formed of a first metal and a second metal layer disposed on the first metal layer and formed of a second metal having a higher density than the first metal, and a second surface acoustic wave resonator including interdigital transducer electrodes disposed on the piezoelectric substrate and having a first metal layer formed of the first metal, but lacking the second metal layer.

In some embodiments, the interdigital transducer elec-trodes of the first and second surface acoustic wave reso-nators further include a third metal layer formed of a third metal having a density higher than the first metal and disposed on the piezoelectric substrate beneath the first metal layer.

In some embodiments, the first and second surface acous-tic wave resonators are temperature compensated acoustic wave resonators including a layer of silicon dioxide cover-ing the interdigital transducer electrodes of the first and second surface acoustic wave resonators and regions of the piezoelectric substrate not covered by the interdigital trans-ducer electrodes of the first and second surface acoustic wave resonators.

In some embodiments, the second surface acoustic wave resonator is a multi-mode resonator.

In some embodiments, the second surface acoustic wave resonator is a double mode resonator.

In some embodiments, the first surface acoustic wave resonator is a single mode resonator.

In some embodiments, the multiplexer further comprises an antenna port and a third resonator, the third resonator being disposed electrically between the antenna port and the second acoustic wave resonator.

In some embodiments, the multiplexer further comprises a receive side filter, the second acoustic wave resonator being included in the receive side filter.

In some embodiments, the piezoelectric substrate is a multilayer piezoelectric substrate including a support sub-strate, a layer of dielectric material disposed on the support substrate, and a layer of piezoelectric material disposed on the layer of dielectric material.

In some embodiments, the multilayer piezoelectric sub-strate further comprises a layer of silicon dioxide covering the interdigital transducer electrodes of the first and second surface acoustic wave resonators and regions of the piezo-electric substrate not covered by the interdigital transducer electrodes of the first and second surface acoustic wave resonators.

In some embodiments, the multilayer piezoelectric sub-strate further comprises a layer of a material having a higher acoustic velocity than that of the layer of piezoelectric material disposed between an upper surface of the support substrate and a lower surface of the layer of dielectric material.

In some embodiments, the interdigital transducer elec-trodes of the first and second surface acoustic wave reso-nators further include a third metal layer disposed on the piezoelectric substrate beneath the first metal layer, the third metal layer being formed of a third metal having a density higher than the first metal and having a thickness less than a thickness of the first metal layer.

In some embodiments, the second metal layer and third metal layer are formed of a same metal.

In some embodiments, an entirety of the interdigital transducer electrodes of the first surface acoustic wave resonator includes the second metal layer.

In some embodiments, busbar electrodes and regions of electrode fingers in a gap region of the first surface acoustic wave resonator include the first metal layer but are free of the second metal layer.

In some embodiments, reflector electrodes of the first surface acoustic wave resonator include the first and second metal layers.

In some embodiments, reflector electrodes of the first surface acoustic wave resonator include the first metal layer but are free of the second metal layer.

In some embodiments, the multiplexer is configured as a duplexer.

In some embodiments, the multiplexer is included in a radio frequency device module.

In some embodiments, the radio frequency device module is included in a radio frequency device.

BRIEF DESCRIPTION OF THE DRAWINGS

Embodiments of this disclosure will now be described, by way of non-limiting example, with reference to the accom-panying drawings.

Figure 1A:
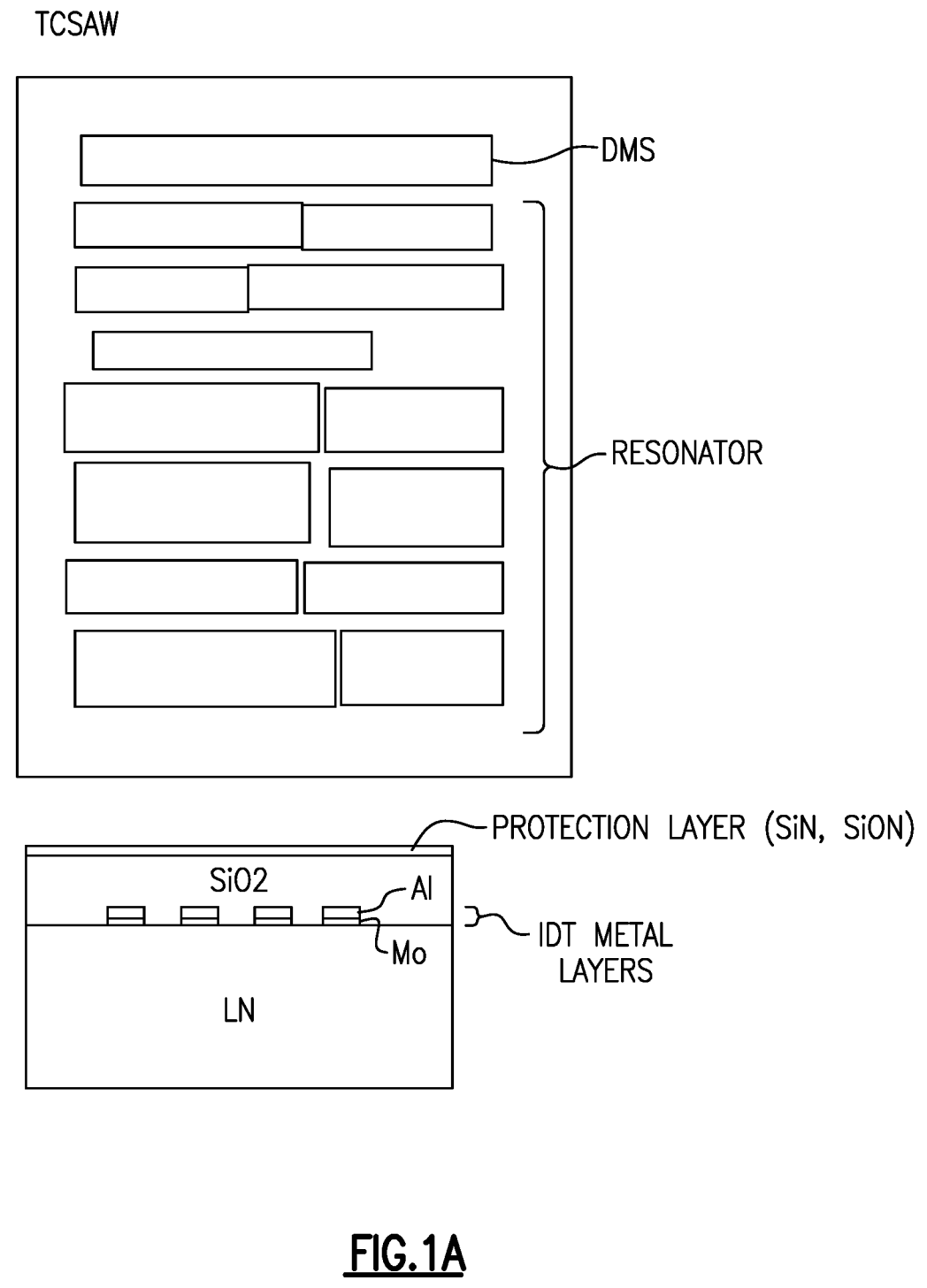

FIG. 1A illustrates the layout of temperature compensated surface acoustic wave (TCSAW) resonators in a duplexer and a cross-sectional view of a portion of a TCSAW resonator;

DETAILED DESCRIPTION OF CERTAIN EMBODIMENTS

Figure 1B:
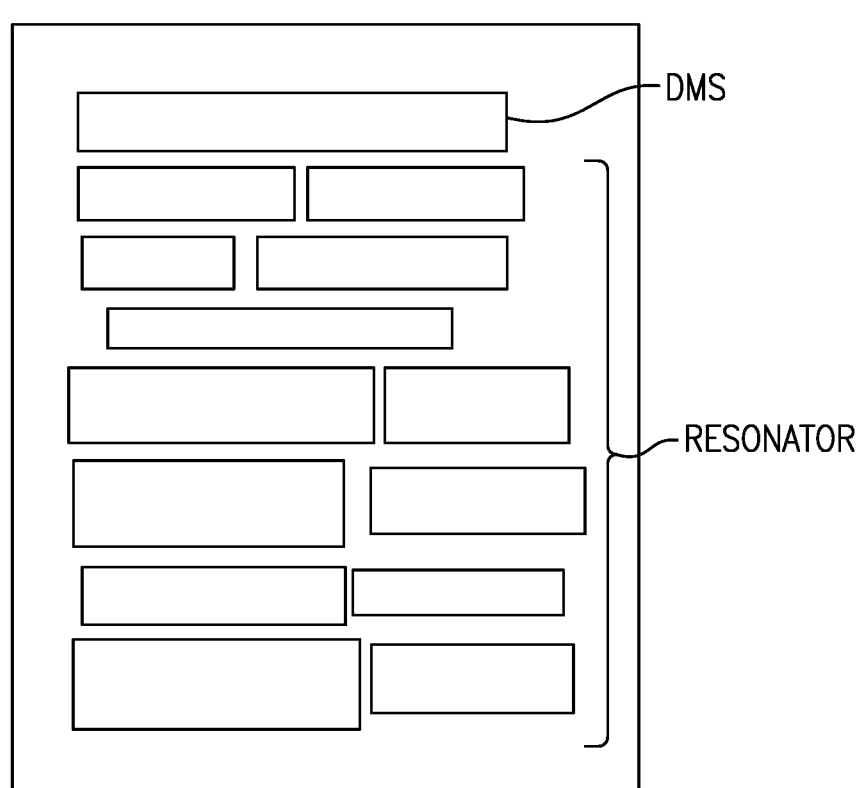
FIG. 1B illustrates the layout of low-velocity temperature compensated surface acoustic wave (LV-TCSAW) resonators in a duplexer and a cross-sectional view of a portion of a LV-TCSAW resonator.
Figure 1B:
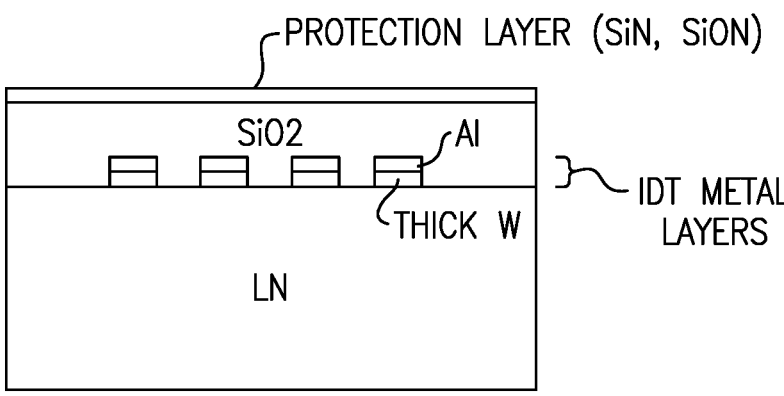

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Aspects and embodiments disclosed herein are generally directed to acoustic wave filters and duplexers formed from same in which different surface acoustic wave (SAW) resonators of different acoustic wave filters have different interdigital transducer electrode structures to optimize their performance characteristics.

Acoustic wave filter-based duplexers or multiplexers may include filters formed from a plurality of acoustic wave resonators which may include single mode surface acoustic wave resonators (indicated in the figures accompanying this disclosure as simply "resonators") and multi-mode surface acoustic wave resonators, for example, double mode surface acoustic wave resonators (indicated in the figures accompanying this disclosure as simply "DMS"). The resonators and DMSs (or multi-mode resonators) may be formed on the same die and have an interdigital transducer (IDT) electrode and reflector electrode structure as illustrated in FIG. 1A. As illustrated in FIG. 1A the IDT electrodes of both the resonators and DMS may be formed from a layer of a high density metal, for example, molybdenum (Mo) disposed on a piezoelectric substrate formed of, for example, lithium niobate (LN) or lithium tantalate (LT). Other high density metals such as platinum (Pt), iridium (Jr), gold (Au), or tungsten (W) may be utilized instead of or in addition to Mo, although the figures accompanying this disclosure will indicate the high density metal as being Mo. A layer of a less dense material, for example, aluminum (Al) may be disposed on top of the layer of high density metal in the IDT electrodes. A layer of a dielectric material having a temperature coefficient of frequency opposite to that of the piezoelectric substrate, for example, silicon dioxide (SiO$_2$) may be disposed on top of the IDT electrodes and piezoelectric substrate. A resonator or DMS having such a layer of dielectric material is referred to herein as a temperature compensated surface acoustic wave resonator (TCSAW). An additional dielectric layer, for example, silicon nitride (Si$_3$N$_4$ or SiN) or silicon oxynitride (SiON) may be disposed on top of the layer of a dielectric material having the temperature coefficient of frequency opposite to that of the piezoelectric substrate as a protective layer or passivation layer.

In many instances, it has been found desirable to reduce the size of SAW resonators and the size of a filter or duplexer including the SAW resonators to provide more functionality within a given footprint, increase the number of devices that may be formed on a single wafer, increase manufacturing die yield, etc. One way of accomplishing this is to increase the density or mass of the IDT electrodes of the SAW resonators by using a higher density metal in the IDT electrodes of the SAW resonators, for example, by switching from Mo to W, or by increasing the thickness of the high density metal layer of the IDT electrodes as illustrated in FIG. 1B. This decreases the acoustic velocity of surface acoustic waves generated by the IDT electrodes in the SAW resonator and provides for the IDT electrodes to be spaced closer together while the SAW resonator exhibits the same frequency characteristics as a corresponding SAW resonator having IDT electrodes with a lower mass. SAW resonators with the higher mass IDT electrodes and temperature compensating dielectric material layer (the SiO$_2$ layer in FIGS. 1A and 1B) are referred to herein as low velocity temperature compensated surface acoustic wave (LV-TCSAW) resonators. In contrast, TCSAW resonators without the higher mass or higher density IDT electrodes, for example, TCSAW resonators as illustrated in FIG. 1A may be referred to herein as "regular velocity" TCSAW resonators.

Figure 2:
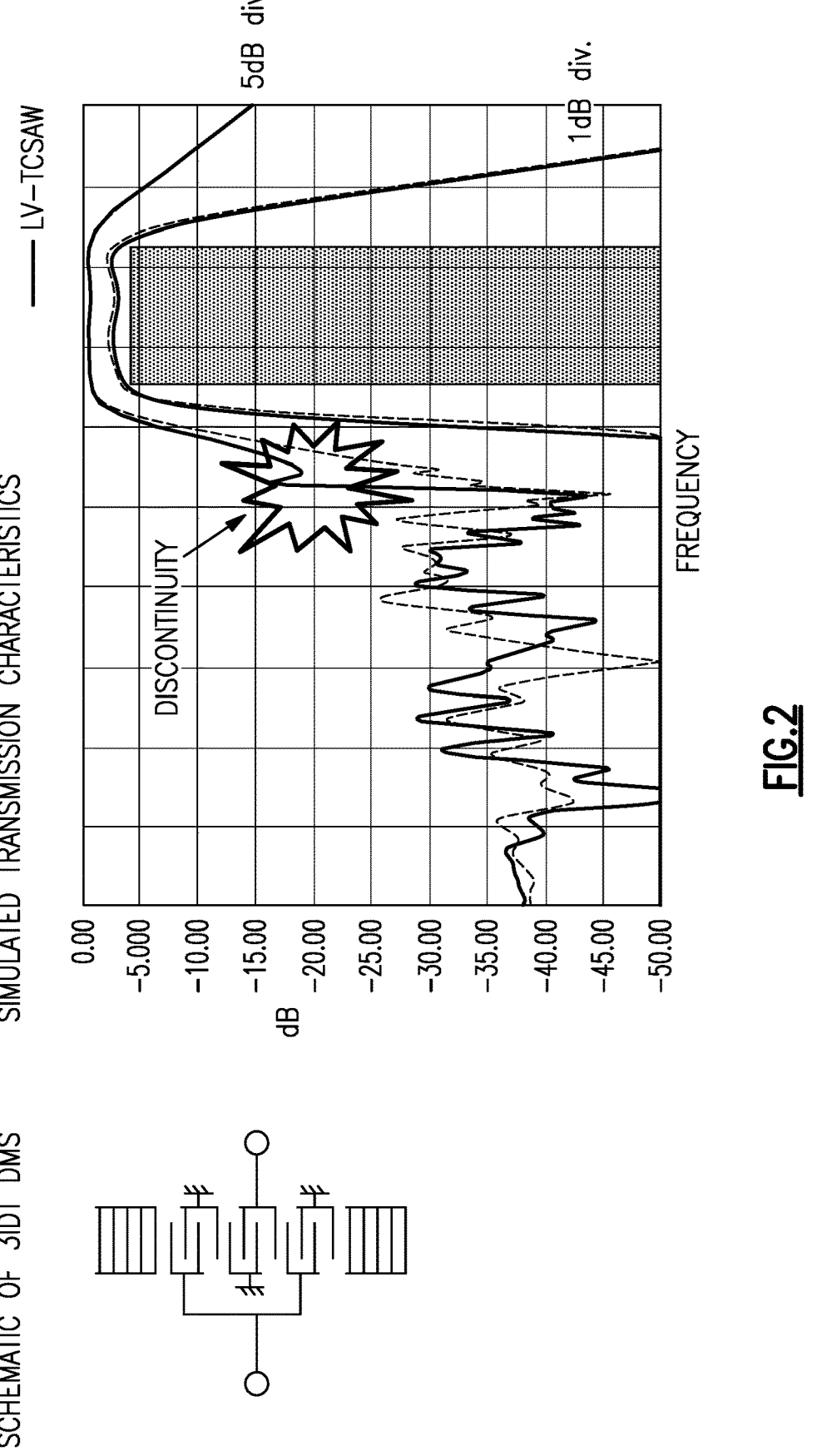
FIG. 2 illustrates simulated transmission parameter curves of a double mode surface acoustic wave resonator (DMS) formed with either TCSAW resonators or LV-TCSAW resonators.

One problem associated with increasing the mass of the IDT electrodes in SAW resonators of a filter or duplexer is that the increased reflection of acoustic waves associated with higher mass or higher density IDT electrodes may cause undesirably discontinuities to be exhibited in the transmission curves of DMS resonators. FIG. 2 illustrates the existence of an undesirable discontinuity in the transmission curve of a three-IDT DMS in a region below the passband. In implementations in which the DMS resonator is utilized in a receive filter of a duplexer, such a discontinuity may reduce the isolation between the transmission and receive passbands because the transmission passband often spans a range of frequencies lower than the range of frequencies spanned by the receive passband, and in some radio frequency bands the transmission and receive passbands are very close.

Figure 3:
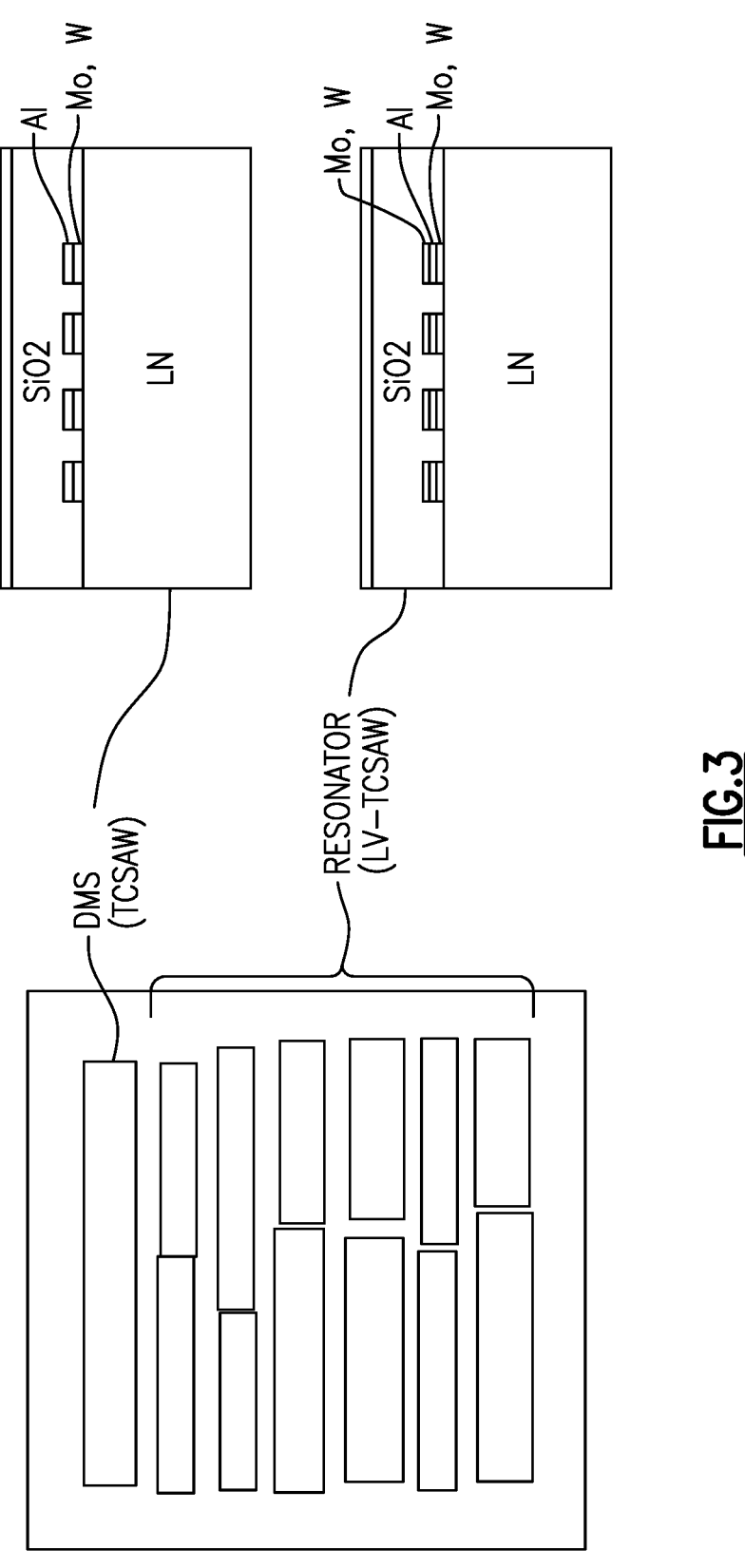
FIG. 3 illustrates the layout of LV-TCSAW resonators and a regular velocity TCSAW DMS in a duplexer and a cross-sectional view of a portion of a LV-TCSAW resonator and of the TCSAW DMS.

To gain the benefits of reduced die size associated with the use of LV-TCSAW resonators in a duplexer while avoiding the disadvantages associated with forming a DMS resonator as a LV-TCSAW, one may form some, or, in some embodiments, all resonators other than the DMS resonator(s) in a duplexer as LV-TCSAW resonators while forming the DMS resonator(s) with lower mass electrodes as a non-LV TCSAW resonator or regular velocity TCSAW resonator. As illustrated in FIG. 3, the LV-TCSAW resonators and regular velocity TCSAW DMS (labelled "TCSAW" without the "LV" prefix) may be formed on the same die. The DMS may have IDT electrodes formed with a lower layer of Mo and an upper layer of Al. The IDT electrodes of the LV-TCSAW resonators may have their mass increased by adding an additional layer of Mo on top of the layer of Al, so that the IDT electrodes are formed of a Mo—Al—Mo metal stack (or a W—Al—W metal stack or a metal stack including other high density metals sandwiching a lower density metal layer). This configuration may be easier to manufacture than one in which the IDT electrodes of the LV-TCSAW resonators had a thicker high density metal layer or a lower layer of a higher density metal than the DMS resonator. In the configuration illustrated in FIG. 3, the IDT electrodes of both the LV-TCSAW resonators and the DMS resonator may each be first formed with the Mo—Al—Mo metal stack and then the upper Mo layer of the DMS resonator may be selectively etched away, for example, with a fluorine plasma dry etch to leave the DMS resonator IDT electrodes with the lower Mo layer an upper Al layer, but no Mo layer on top of the Al layer. The lower Mo layer and Al layer of the IDT electrodes of the LV-TCSAW resonators may thus have the same thicknesses as the Mo and Al layers of the IDT electrodes of the DMS resonator.

Figure 4A:
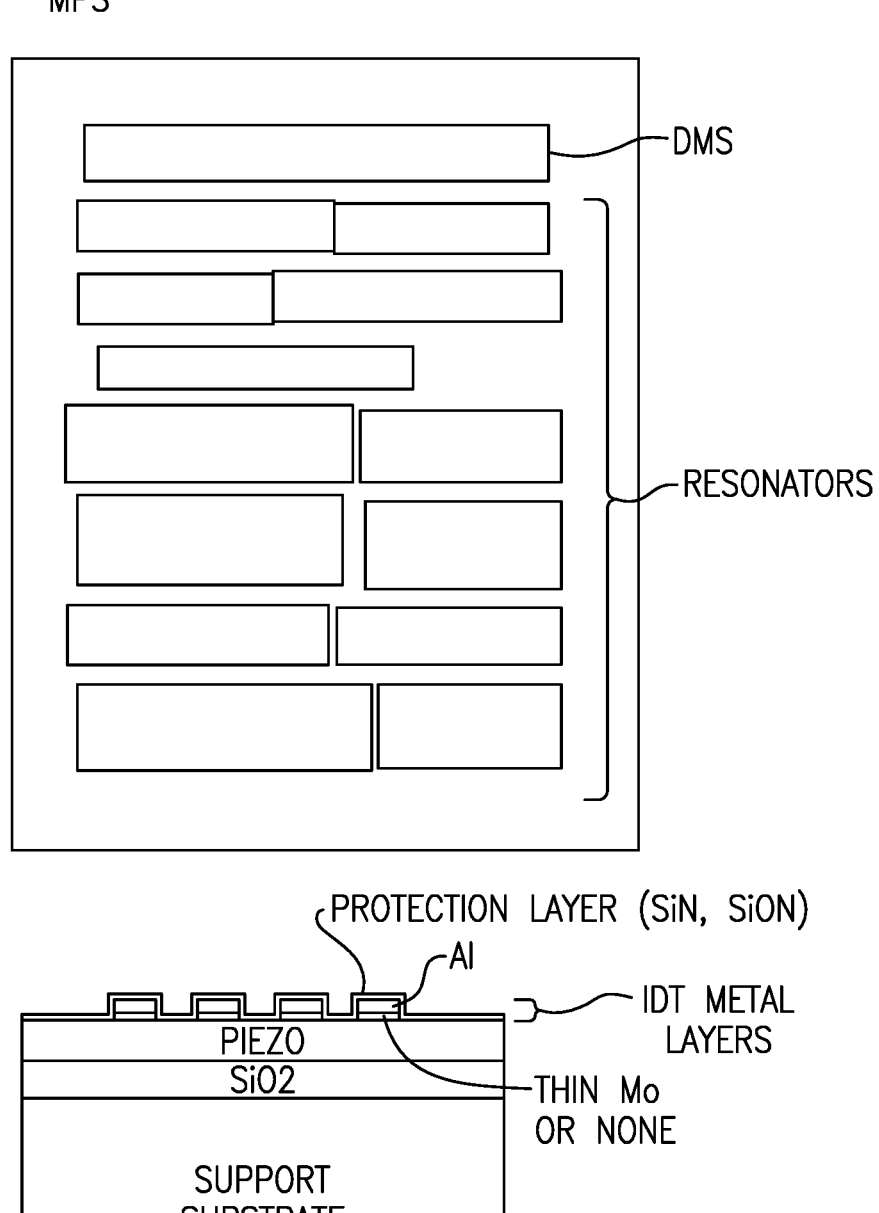
FIG. 4A illustrates the layout of multilayer piezoelectric substrate (MPS) surface acoustic wave resonators in a duplexer and a cross-sectional view of a portion of an MPS resonator.

A similar strategy may be used to form a duplexer including DMS resonators and single mode SAW resonators including a multilayer piezoelectric substrate (MPS) on the same die and. FIG. 4A illustrates the configuration of a baseline example of regular velocity MPS SAW resonators. The MPS SAW resonators include a multilayer substrate having a lower support substrate portion which may be or comprise a high acoustic impedance material, for example, silicon, alumina, quartz, sapphire, or another material. A layer of dielectric material, for example, SiO$_2$ is disposed on the upper side of the lower support substrate portion. A layer of piezoelectric material, for example, LT or LN is disposed on the layer of dielectric material. The dielectric (SiO$_2$) layer may function as a temperature compensating layer for the device because it has a temperature coefficient of frequency with an opposite sign than that of the piezoelectric material in the layer of piezoelectric material. IDT electrodes formed of, for example, an optional thin lower layer of Mo and an upper layer of Al and covered with a protection or passivation layer of SiN or SiON are disposed on the top of the layer of piezoelectric material. The protection layer may also cover the upper surface of the layer of piezoelectric material between the IDT electrodes. When the optional thin lower layer of Mo is not used the Al layer of the IDT electrodes is disposed directly on the layer of piezoelectric material.

Figure 4B:
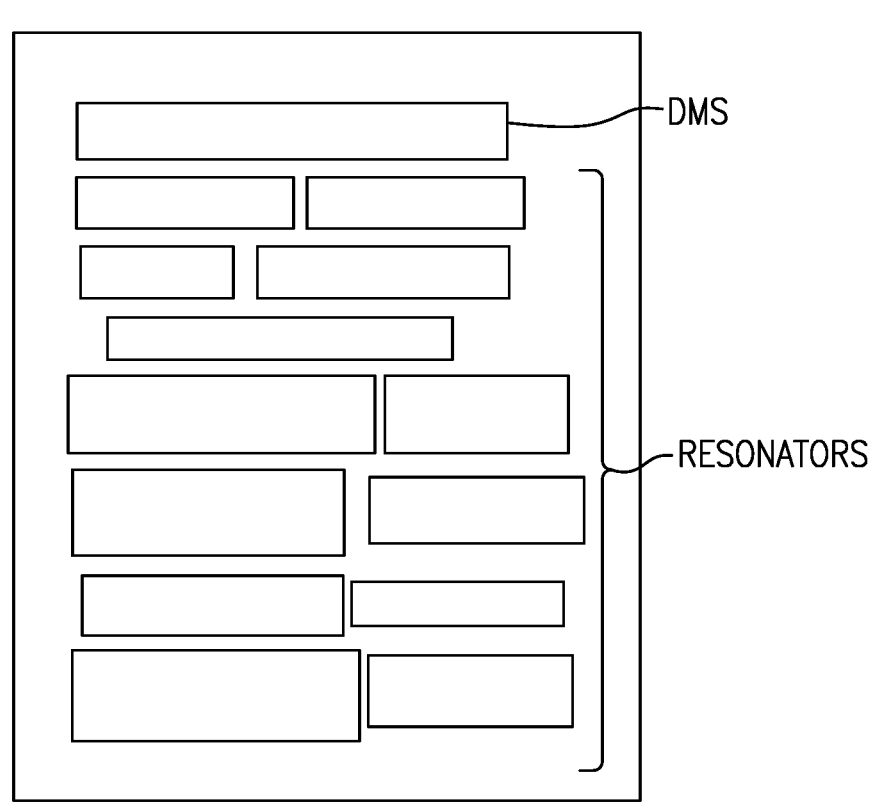
FIG. 4B illustrates the layout of low-velocity temperature MPS (LV-MPS) resonators in a duplexer and a cross-sectional view of a portion of a LV-MPS resonator.
Figure 4B:
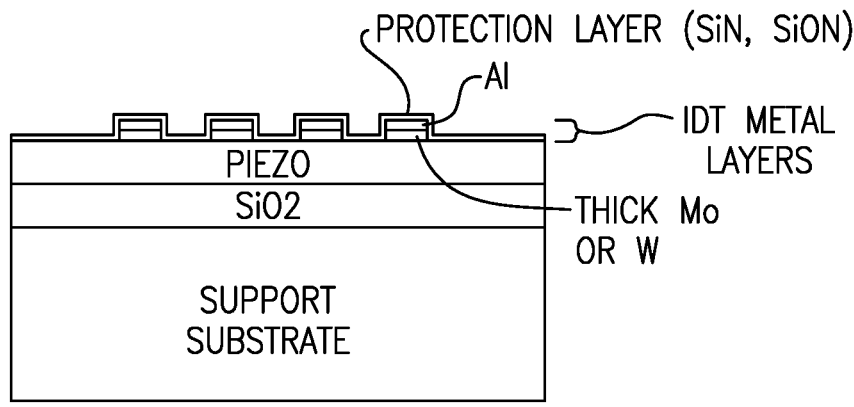

FIG. 4B illustrates how the MPS SAW resonator structure of FIG. 4A can be modified to produce a low velocity multilayer piezoelectric substrate SAW resonator (LV-MPS SAW resonator). The LV-MPS SAW resonator of FIG. 4B is substantially the same as the MPS SAW resonator of FIG. 4A except for the addition of a layer (or of a thicker layer) of a high density metal, for example, Mo or W below the Al layer in the IDT electrodes.

Figure 5:
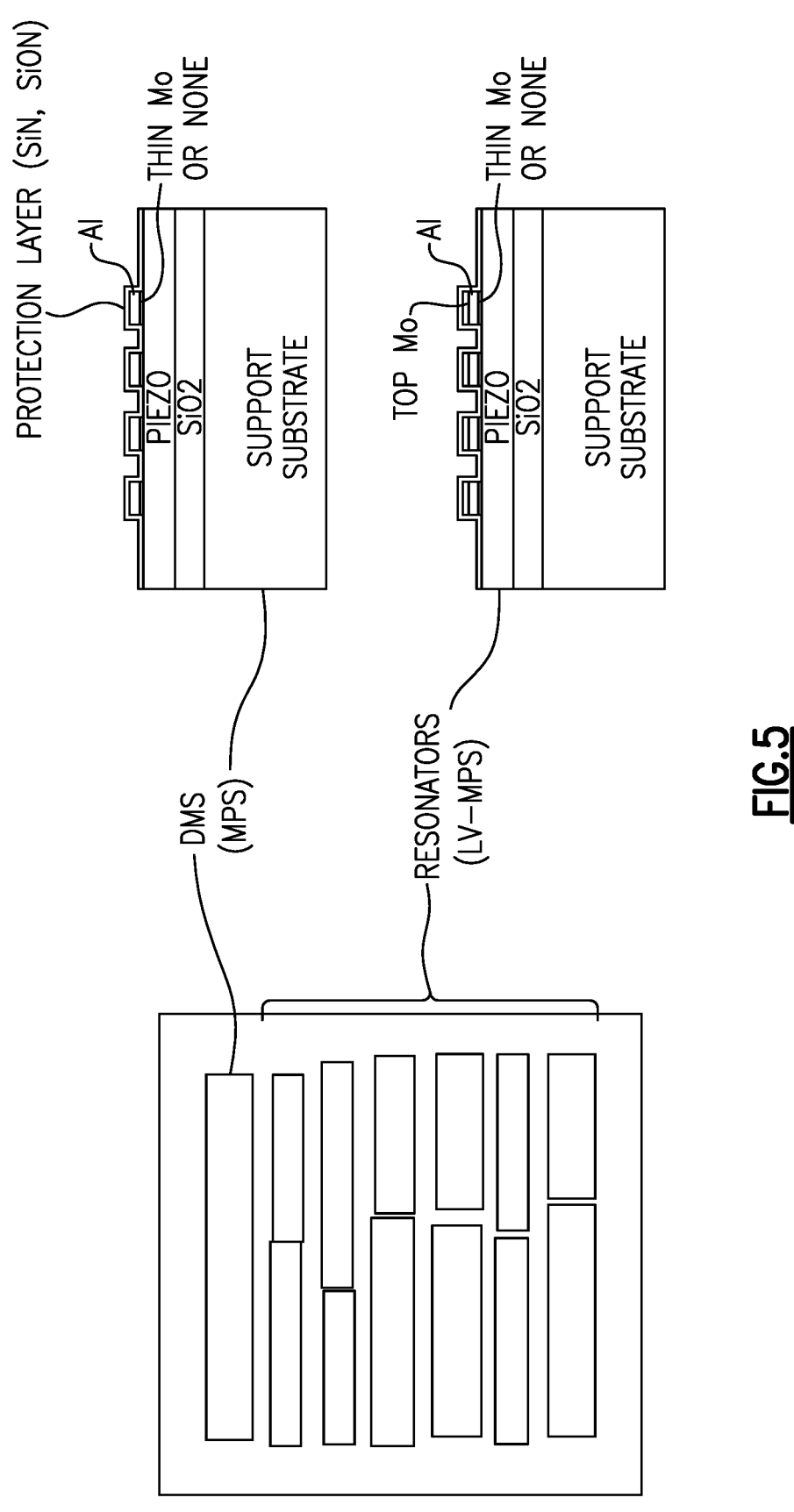
FIG. 5 illustrates the layout of LV-MPS resonators and a regular velocity MPS DMS in a duplexer and a cross-sectional view of a portion of a LV-MPS resonator and of the MPS DMS.

A DMS formed with an LV-MPS SAW IDT structure such as illustrated in FIG. 4B may exhibit similar degradation in its transmission curve as discussed above with reference to FIGS. 1B and 2. Accordingly, if LV-MPS single mode SAW resonators are to be combined with a MPS DMS resonator or resonators on a single die the IDT electrodes of the MPS DMS resonator(s) should have a lower mass than the IDT electrodes of the single mode SAW resonators. One example of IDT electrode structures for LV-MPS single mode SAW resonators and a regular velocity MPS DMS resonator or resonators (labelled "MPS" without the "LV" prefix) formed on a single die is illustrated in FIG. 5. The IDT electrodes of both the LV-MPS single mode SAW resonators and the regular velocity MPS DMS resonator may optionally include a thin lower layer of Mo (or other high density metal discussed above) disposed on the layer of piezoelectric material in the MPS. A layer of Al is disposed on the layer of Mo when the Mo layer is utilized, or the layer of Al is disposed directly on the layer of piezoelectric material when the lower layer of Mo is not utilized. The IDT electrodes of the LV-MPS single mode SAW resonators include an upper layer of Mo (or other high density metal discussed above) disposed on the layer of Al. This upper layer of Mo is not included in the IDT electrodes of the regular velocity MPS DMS resonator. A protective or passivation layer of, for example, SiN or SiON is formed on the upper metal layer of the IDT electrodes (the Al layer of the regular velocity MPS DMS resonator and the upper Mo layer of the LV-MPS single mode SAW resonators) and on the exposed upper surface of the layer of piezoelectric material not covered by the IDT electrodes.

Figure 6A:
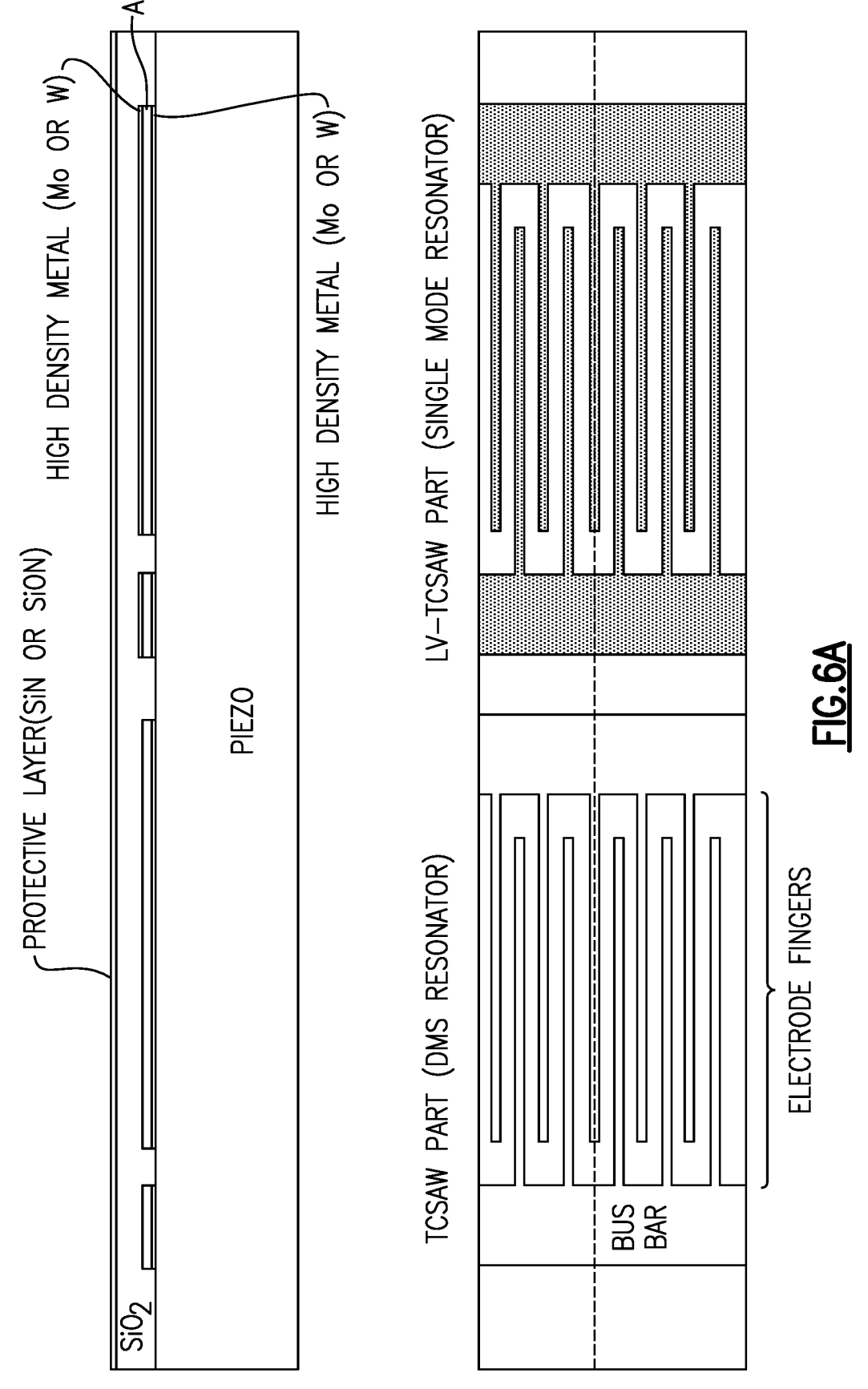
FIG. 6A illustrates cross-sectional and plan views of portions of a regular velocity TCSAW and a LV-TCSAW resonator that may be used together in a duplexer.

Side and plan views of the IDT electrode structures of single mode SAW and DMS TCSAW resonators are illustrated in FIG. 6A. As shown, the DMS TCSAW resonator includes bus bar electrodes and IDT electrode fingers formed from a thin lower layer of Mo and an upper layer of Al and is thus a regular velocity TCSAW resonator. The single mode SAW resonator includes an additional upper layer of Mo disposed on the Al layer in both the bus bar electrodes and IDT electrode fingers and is thus an LV-TCSAW resonator. The IDT electrodes of both components are disposed on a piezoelectric substrate and are covered with a layer of $SiO_2$ and a protective or passivation layer of SiN or SiON. The spacing between the single mode and DMS TCSAW resonators is not to scale.

Figure 6B:
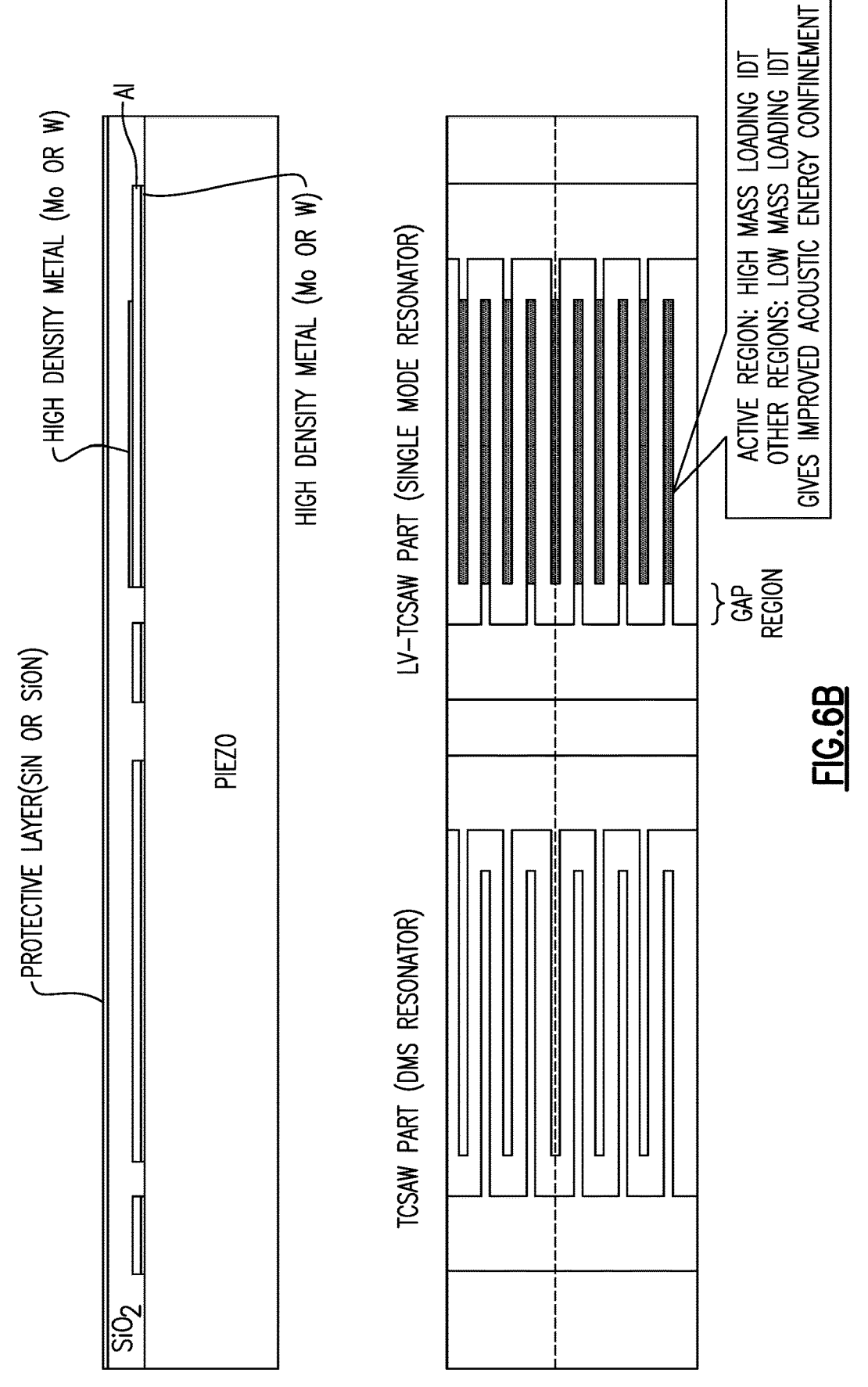
FIG. 6B illustrates cross-sectional and plan views of portions of a regular velocity TCSAW and an alternative form of LV-TCSAW resonator that may be used together in a duplexer.

In an alternative embodiment illustrated in FIG. 6B, the single mode SAW resonators may include bus bar electrodes and portions of the IDT electrode fingers in gap regions between the tips of the electrode fingers and opposing bus bars that do not include the upper Mo layer. This structure may provide for improved acoustic energy confinement within the active region of the device (the aperture region where the opposing IDT electrode fingers are interleaved).

Figure 7A:
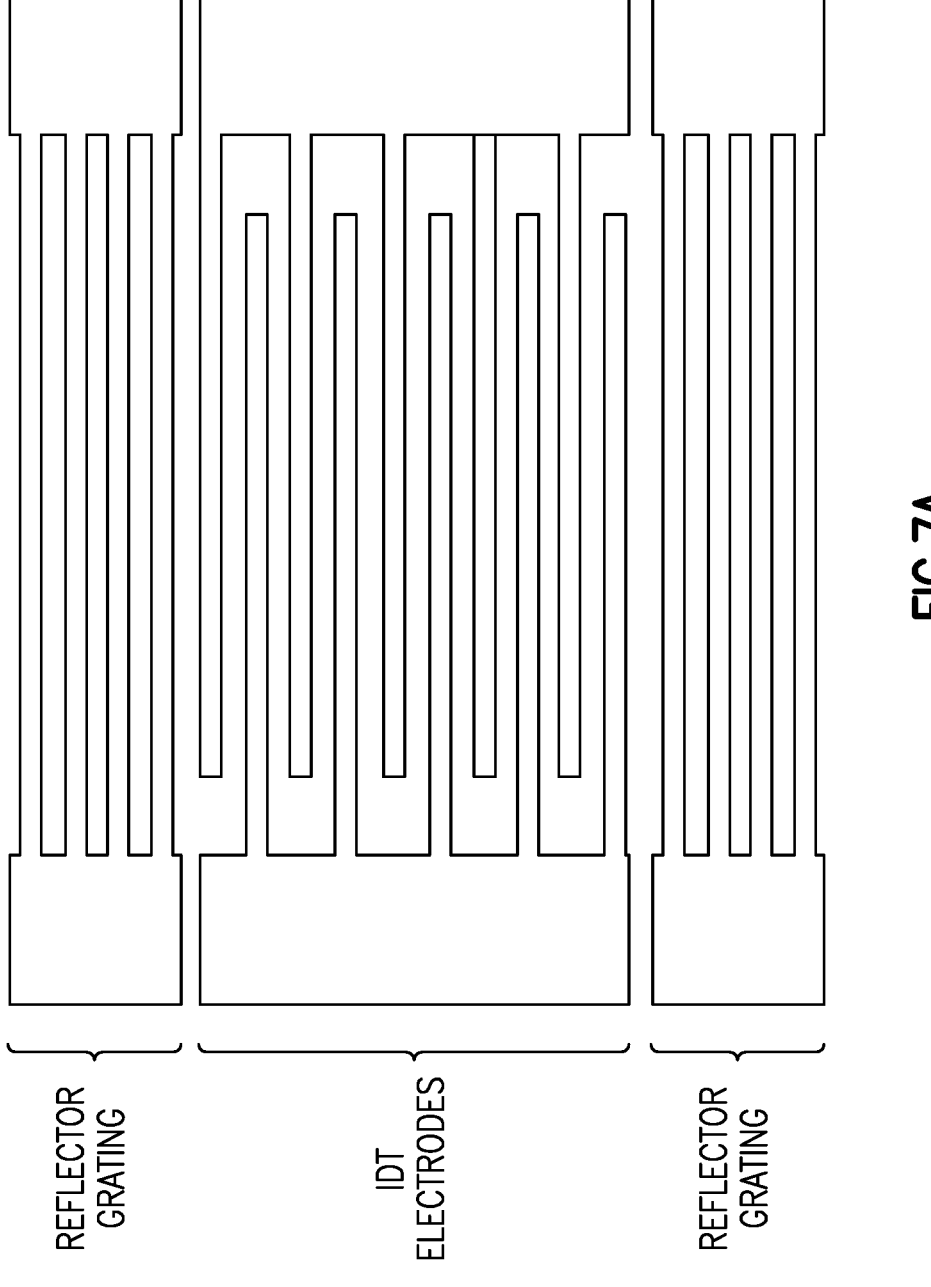
FIG. 7A illustrates a first configuration of interdigital transducer (IDT) electrodes and reflector electrodes that may be utilized in embodiments of surface acoustic wave (SAW) resonators disclosed herein.
Figure 7B:
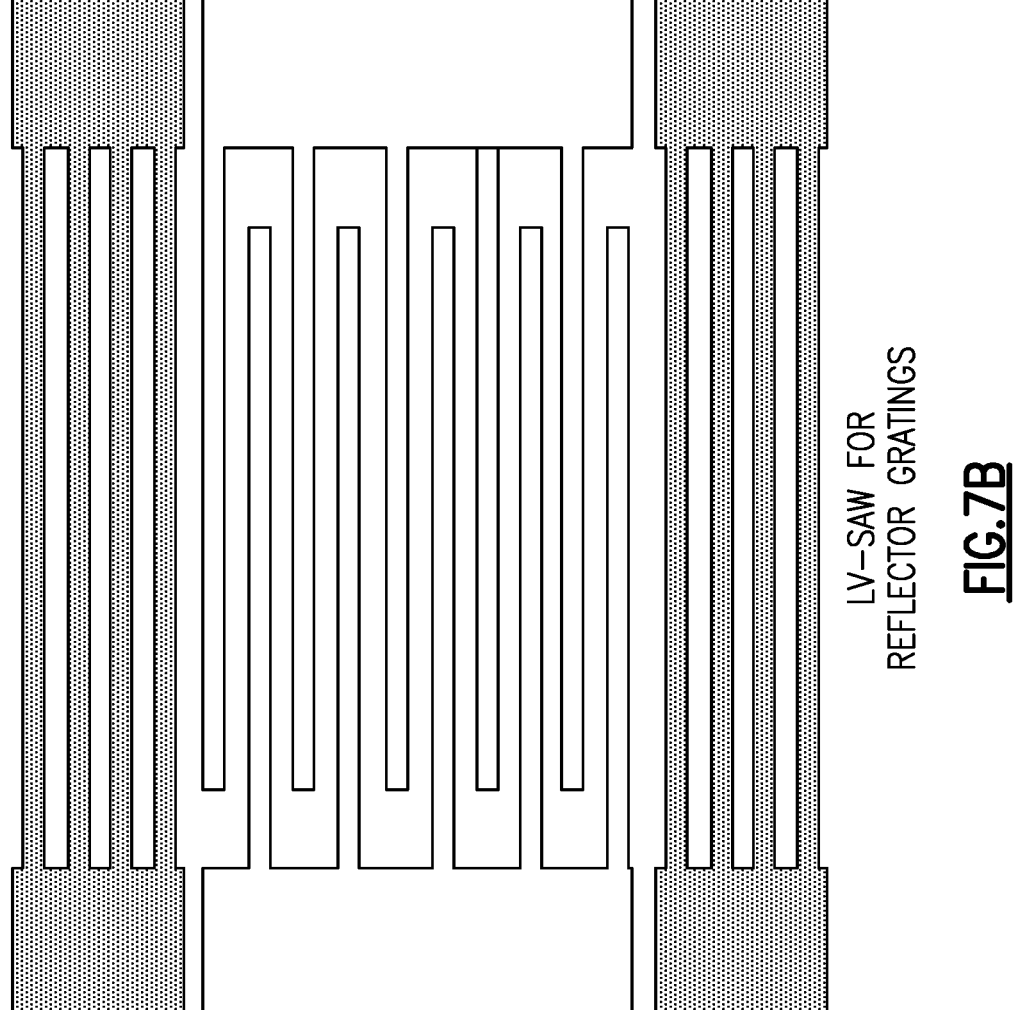
FIG. 7B illustrates a second configuration of interdigital transducer (IDT) electrodes and reflector electrodes that may be utilized in embodiments of surface acoustic wave (SAW) resonators disclosed herein.
Figure 7C:
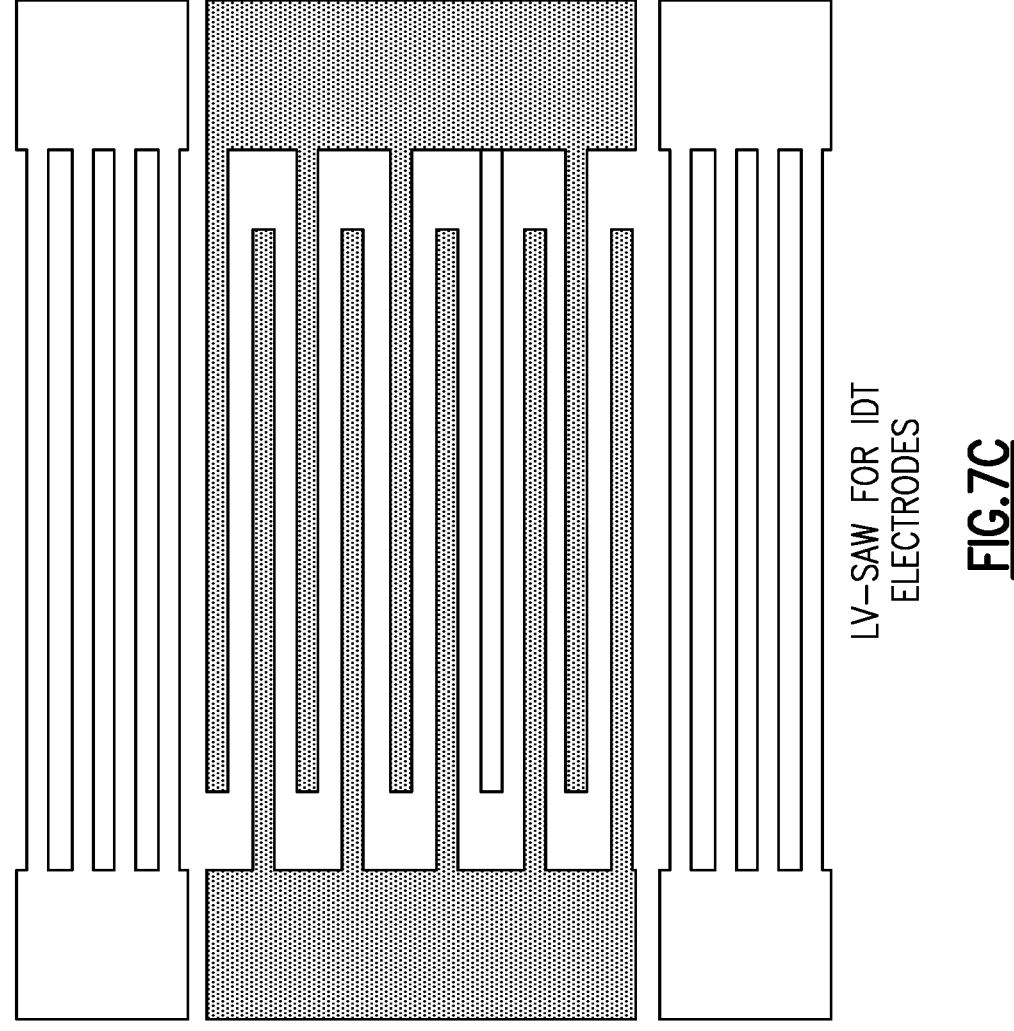
FIG. 7C illustrates a third configuration of interdigital transducer (IDT) electrodes and reflector electrodes that may be utilized in embodiments of surface acoustic wave (SAW) resonators disclosed herein.

In SAW resonators including reflector gratings, the reflector gratings may have the same metal layer stacks as the IDT electrodes, for example, with or without the upper layer of high density metal, as illustrated in FIG. 7A. Alternatively, the reflector gratings may include the upper layer of high density metal while the IDT electrodes do not (FIG. 7B), or the IDT electrodes may include the upper layer of high density metal while the reflector gratings do not (FIG. 7C). These different options illustrated in FIGS. 7A-7C may apply to either TCSAW or MPS SAW resonator structures.

Figure 8A:
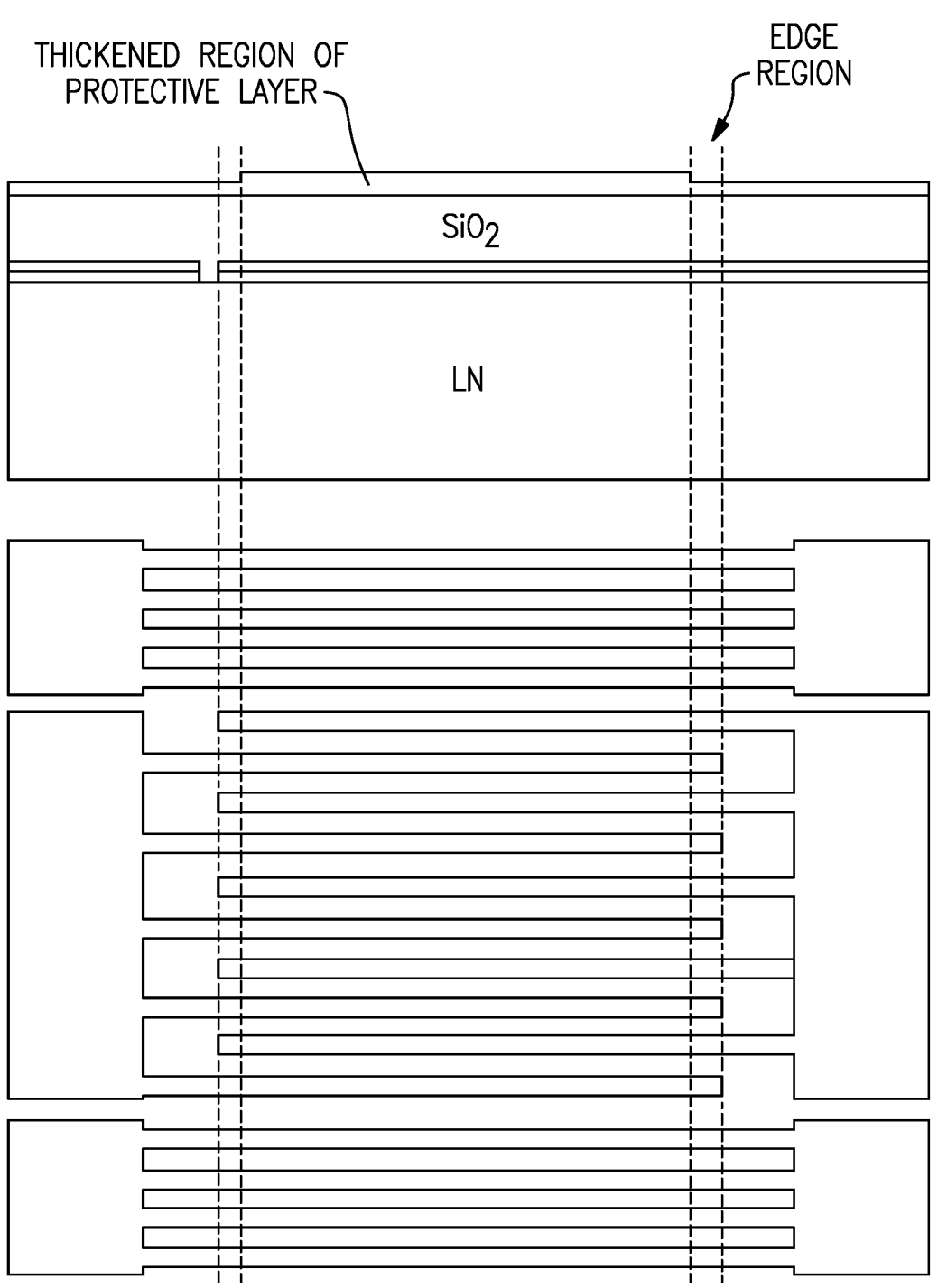
FIG. 8A illustrates a cross-section and plan view of a portion of a TCSAW resonator including a feature for suppressing transverse acoustic waves.
Figure 8B:
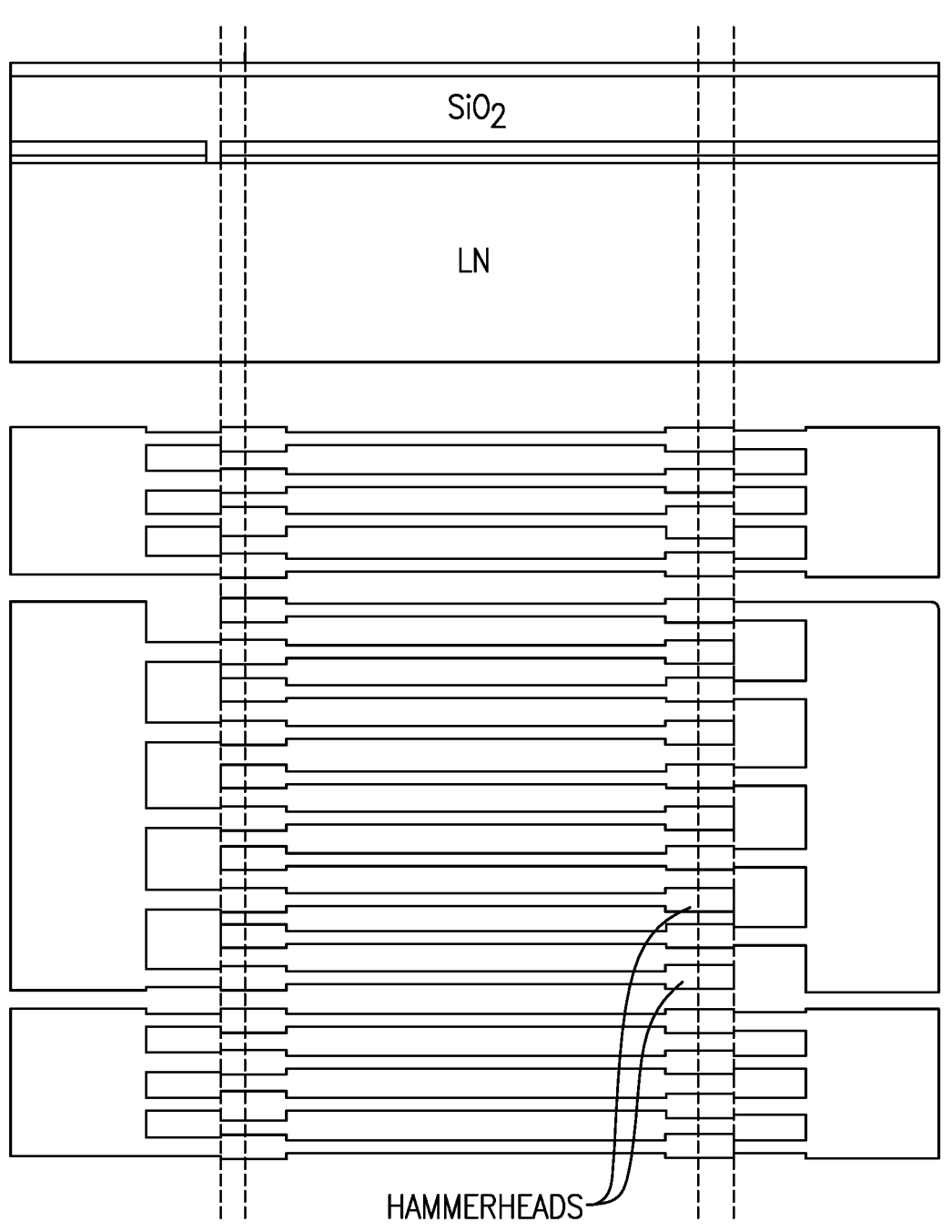
FIG. 8B illustrates a cross-section and plan view of a portion of a TCSAW resonator including another feature for suppressing transverse acoustic waves.
Figure 8C:
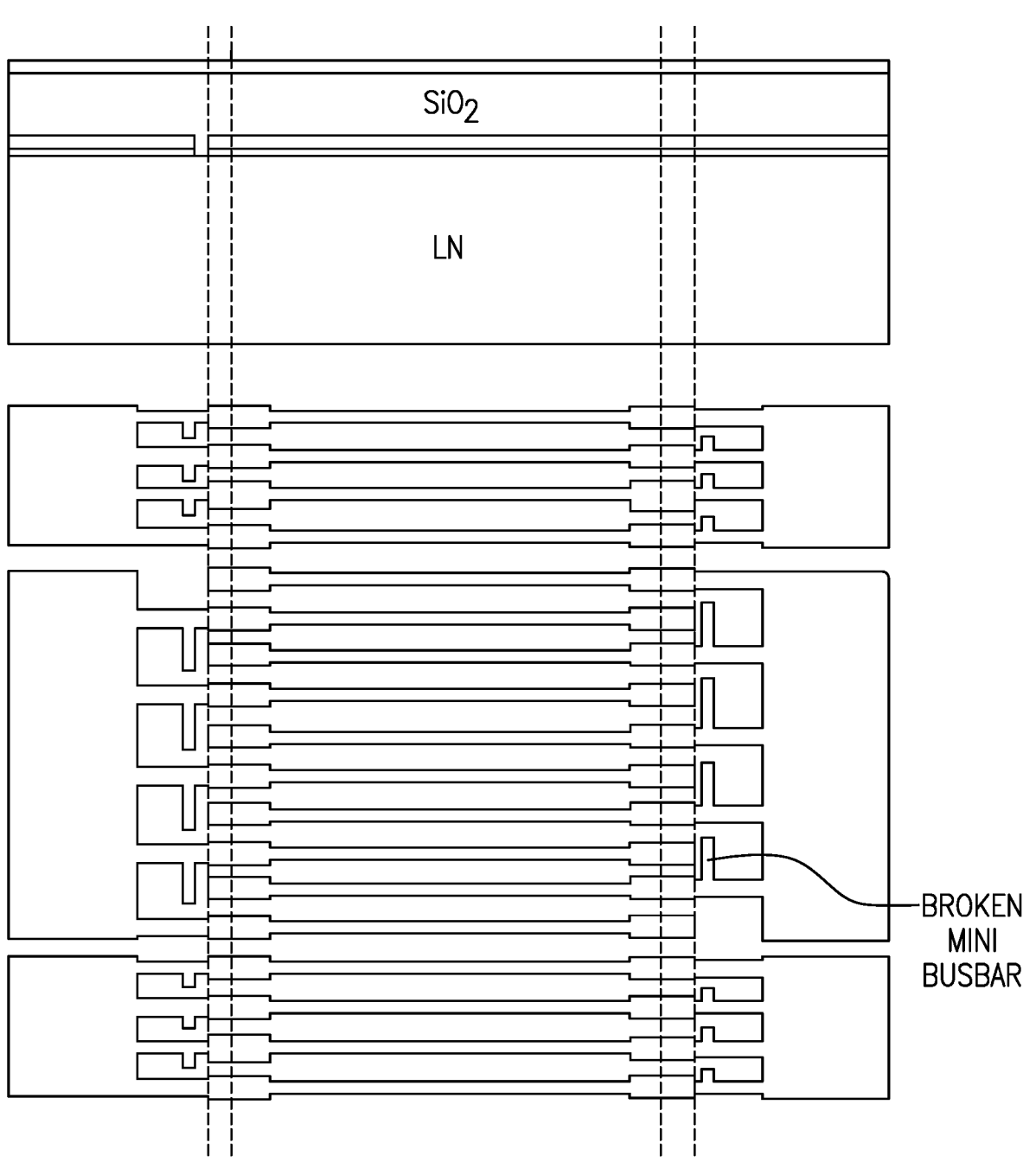
FIG. 8C illustrates a cross-section and plan view of a portion of a TCSAW resonator including another feature for suppressing transverse acoustic waves.
Figure 8D:
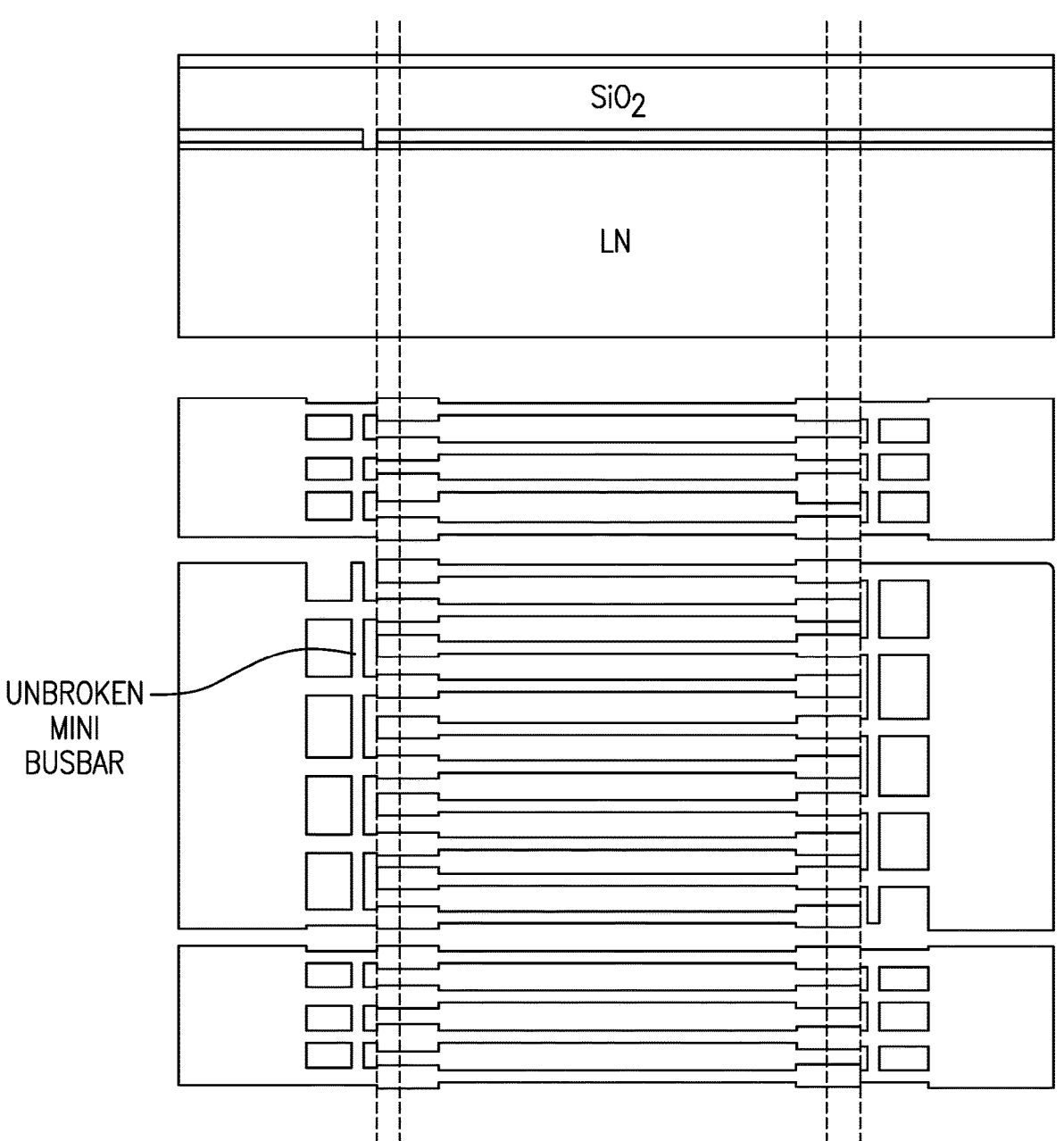
FIG. 8D illustrates a cross-section and plan view of a portion of a TCSAW resonator including another feature for suppressing transverse acoustic waves.
Figure 8E:
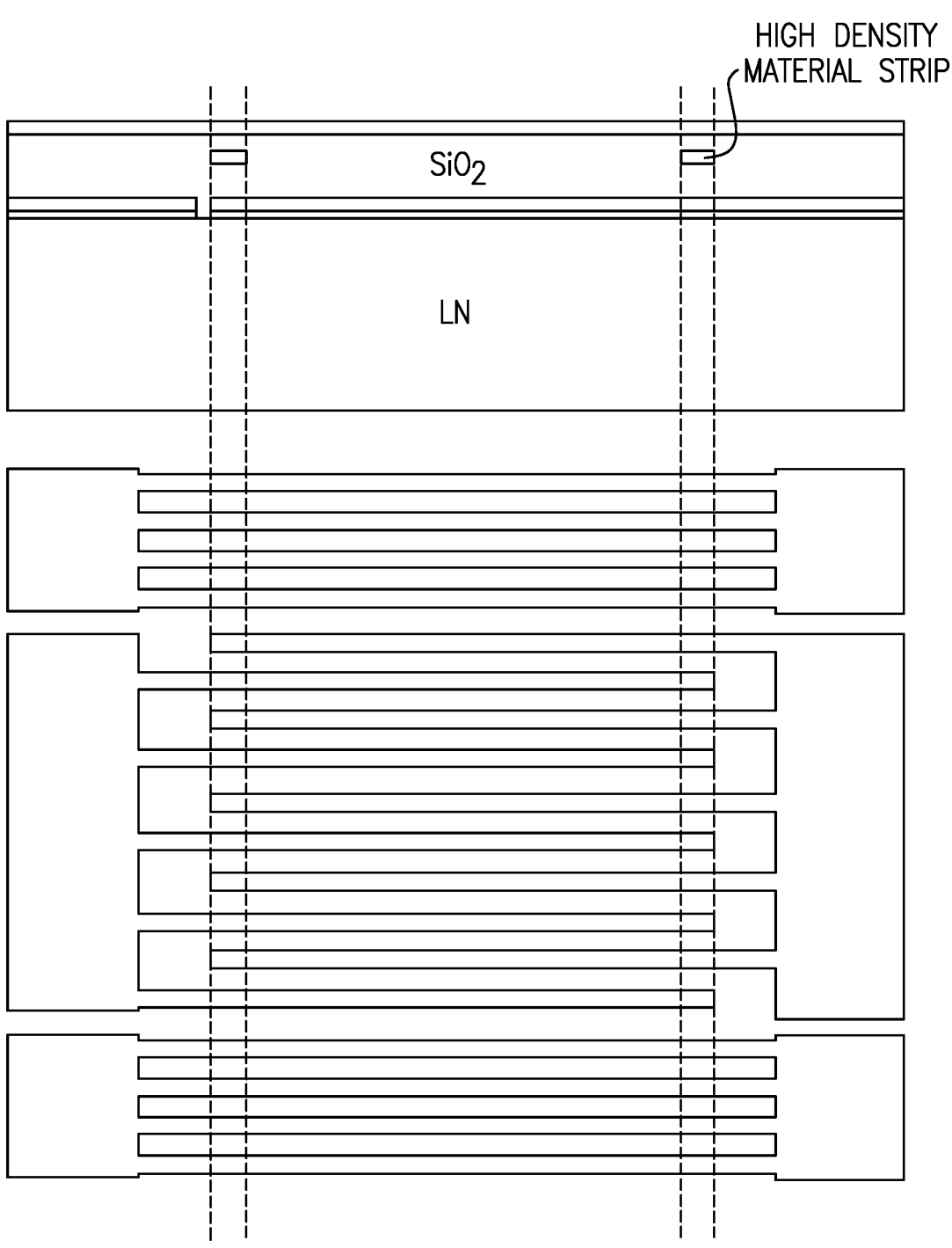
FIG. 8E illustrates a cross-section and plan view of a portion of a TCSAW resonator including another feature for suppressing transverse acoustic waves.
Figure 8F:
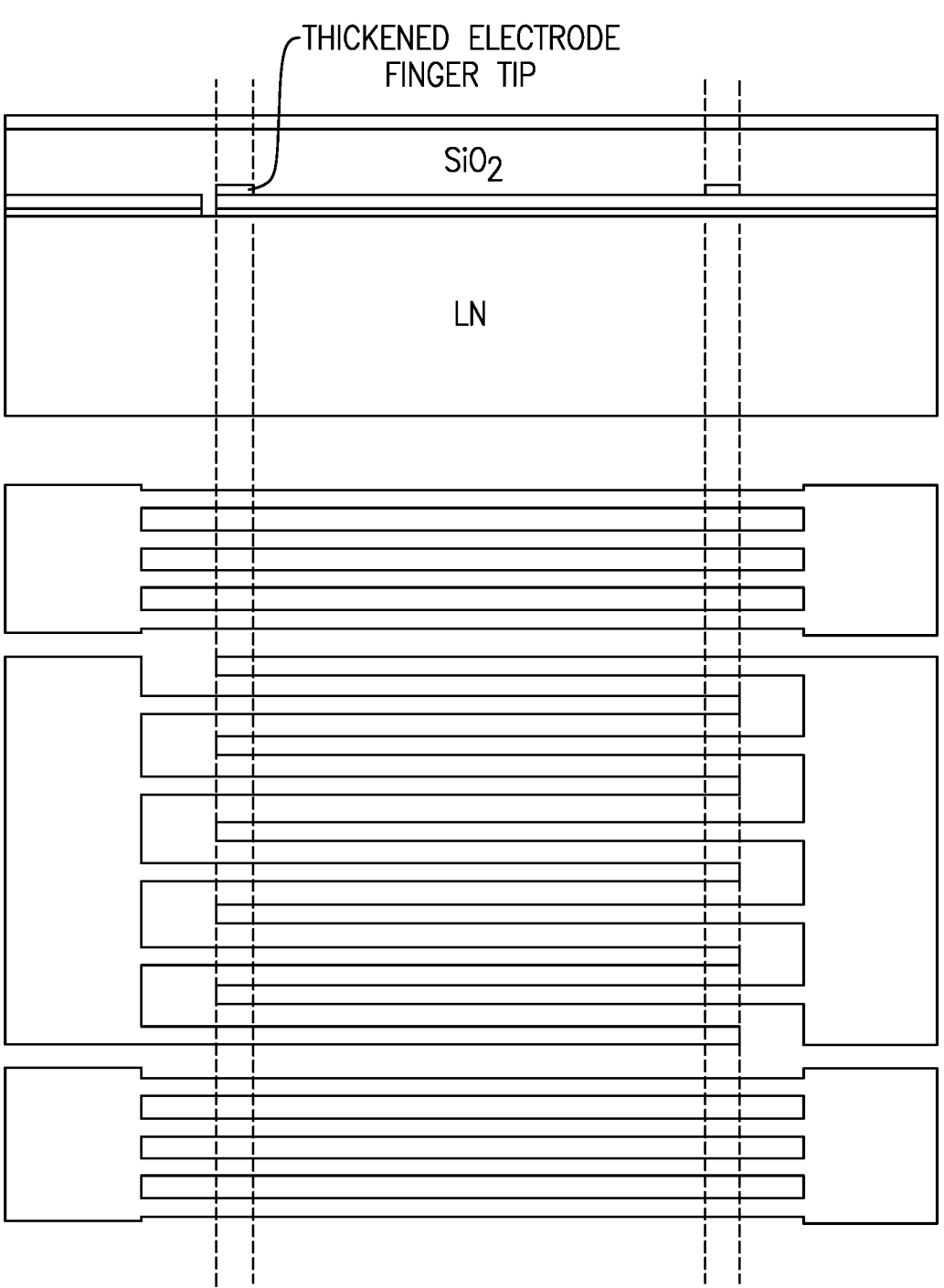
FIG. 8F illustrates a cross-section and plan view of a portion of a TCSAW resonator including another feature for suppressing transverse acoustic waves.

The IDT electrodes and/or film structure in TCSAW resonators (single mode or DMS) may include various features to suppress unwanted transverse acoustic wave modes. Some examples of such features are illustrated in cross-sectional and plan views in FIGS. 8A-8F. FIG. 8A illustrates that a thickened region of the protective or passivation layer (SiN or SiON) may be formed over the central active region of the IDT electrodes. In some embodiments the thickened region of the protective or passivation layer does not cover the tips of the IDT electrode fingers in edge regions of the resonator. FIG. 8B illustrates that portions of the IDT electrode fingers (and optionally the reflector electrodes) within edge regions of IDT electrodes may be widened or provided with a greater duty factor than other regions of the IDT electrode fingers, forming what may be referred to as a "hammerhead" structure. FIG. 8C illustrates that broken "mini busbar" structures may be formed within the gap regions of the IDT electrodes and optionally in regions of the reflector electrodes aligned with the broken mini busbars in the IDT electrodes. FIG. 8C illustrates the broken mini busbar structures in combination with hammerhead electrode structures, but it should be appreciated that the broken mini busbars may be utilized without the hammerhead structures. FIG. 8D illustrated that unbroken or continuous mini busbar structures may be formed in the gap regions of the IDT electrodes, optionally along with aligned mini busbars in the reflector electrodes and/or optionally along with hammerhead structures. FIG. 8E illustrates that strips of a material with a higher density than $SiO_2$, for example, metal strips, may be formed within the layer of $SiO_2$ above tips of the IDT electrode fingers (and optionally over the reflector electrodes in regions aligned with the IDT electrode tips). FIG. 8F illustrates that tip regions of the IDT electrodes may be thickened, for example, by deposition of an additional or thicker metal layer in the tip regions. Any of the features illustrated in FIGS. 8A-8F may be combined with one another in any desired combination to facilitate suppression of transverse mode acoustic waves in a TCSAW resonator.

Figure 9A:
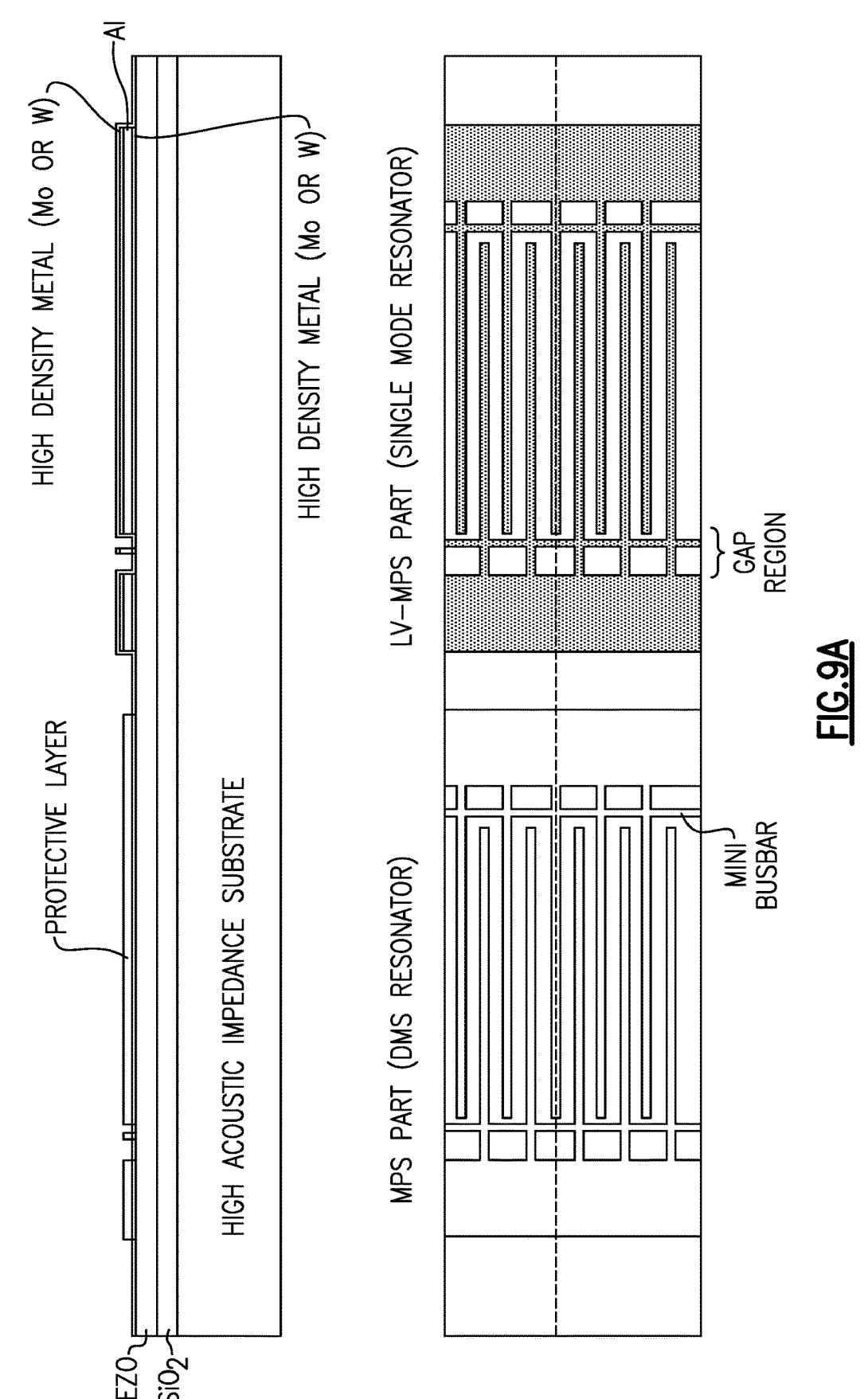
FIG. 9A illustrates cross-sectional and plan views of portions of a regular velocity MPS resonator and a LV-MPS resonator that may be used together in a duplexer.

Side and plan views of the IDT electrode structures of MPS single mode SAW and DMS SAW resonators are illustrated in FIG. 9A. As shown, the DMS MPS SAW resonator includes bus bar electrodes and IDT electrode fingers formed from a thin lower layer of Mo (or W) and an upper layer of Al and is thus a regular velocity MPS SAW resonator. The single mode SAW resonator includes an additional upper layer of Mo (or W) disposed on the Al layer in both the bus bar electrodes and IDT electrode fingers and is thus an LV-MPS SAW resonator. The IDT electrodes of both components and the upper surface of the piezoelectric substrate are covered in a protective or passivation material layer (SiN or SiON). The IDT electrodes of both components may include mini busbars in their gap regions. The spacing between the single mode and DMS MPS SAW resonators is not to scale.

Figure 9B:
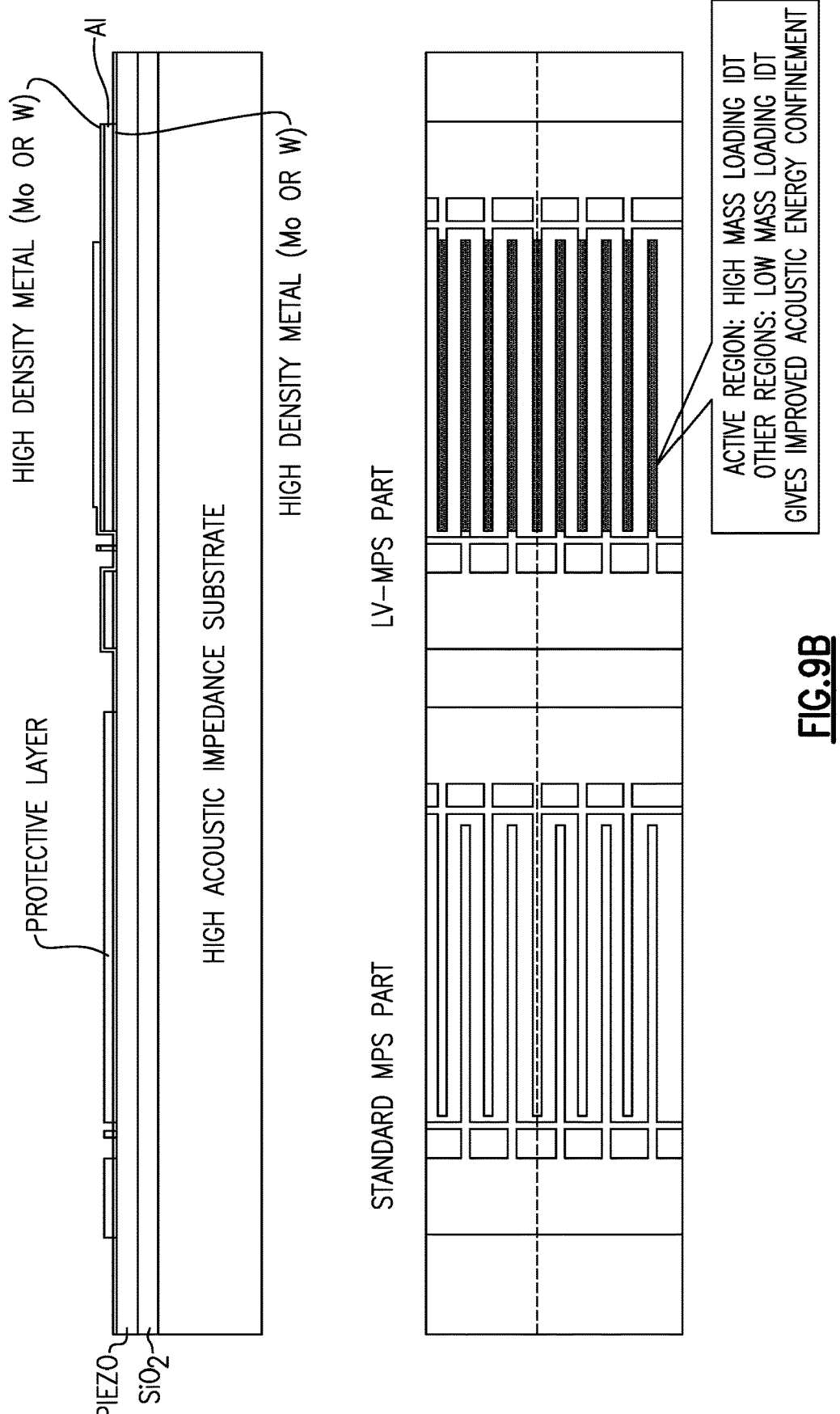
FIG. 9B illustrates cross-sectional and plan views of portions of a regular velocity MPS resonator and an alternative form of LV-MPS resonator that may be used together in a duplexer.

In an alternative embodiment illustrated in FIG. 9B, the single mode resonators may include bus bar electrodes and portions of the IDT electrode fingers in the gap regions that do not include the upper Mo (or W) layer. This structure may provide for improved acoustic energy confinement within the active region of the device.

Figure 10A:
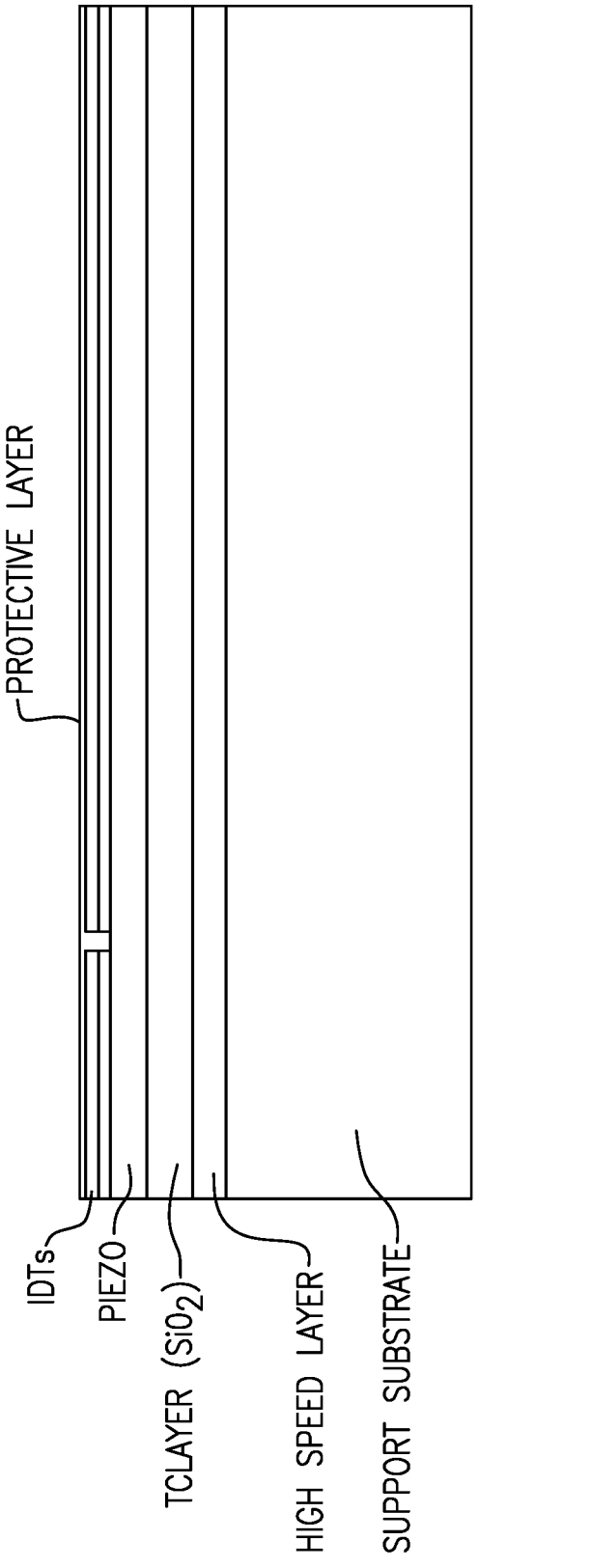
FIG. 10A illustrates an alternative substrate structure that may be included in MPS resonators disclosed herein.
Figure 10B:
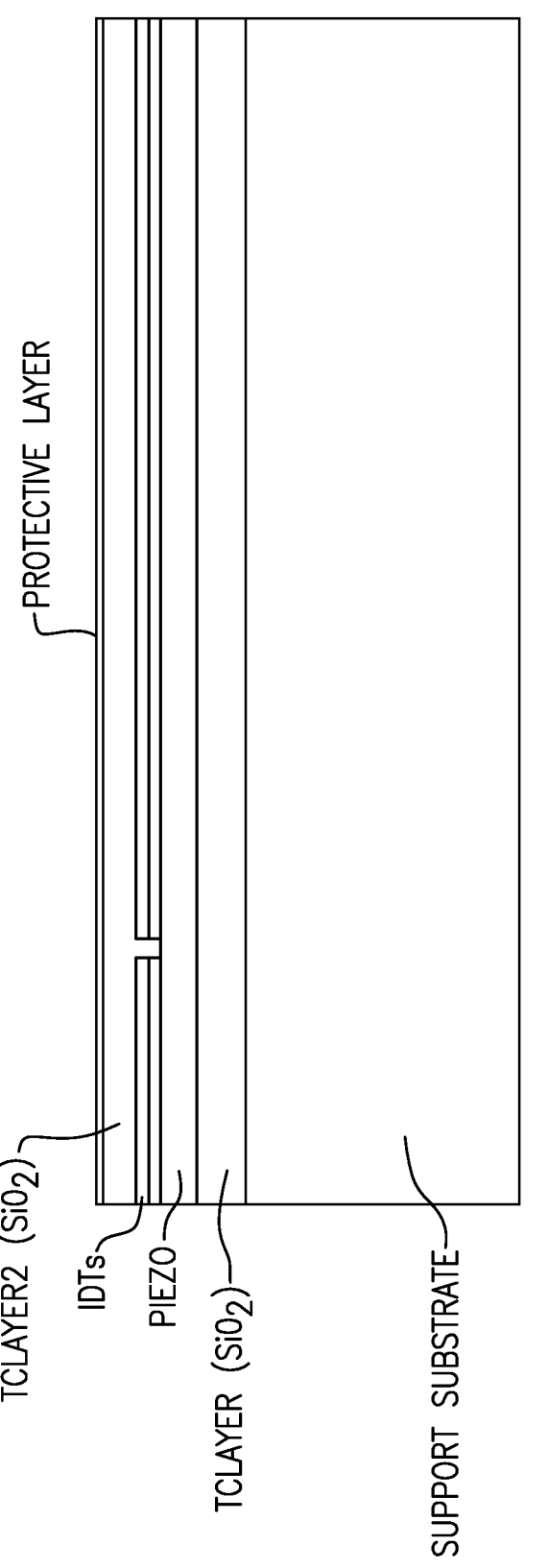
FIG. 10B illustrates another alternative substrate structure that may be included in MPS resonators disclosed herein.
Figure 10C:
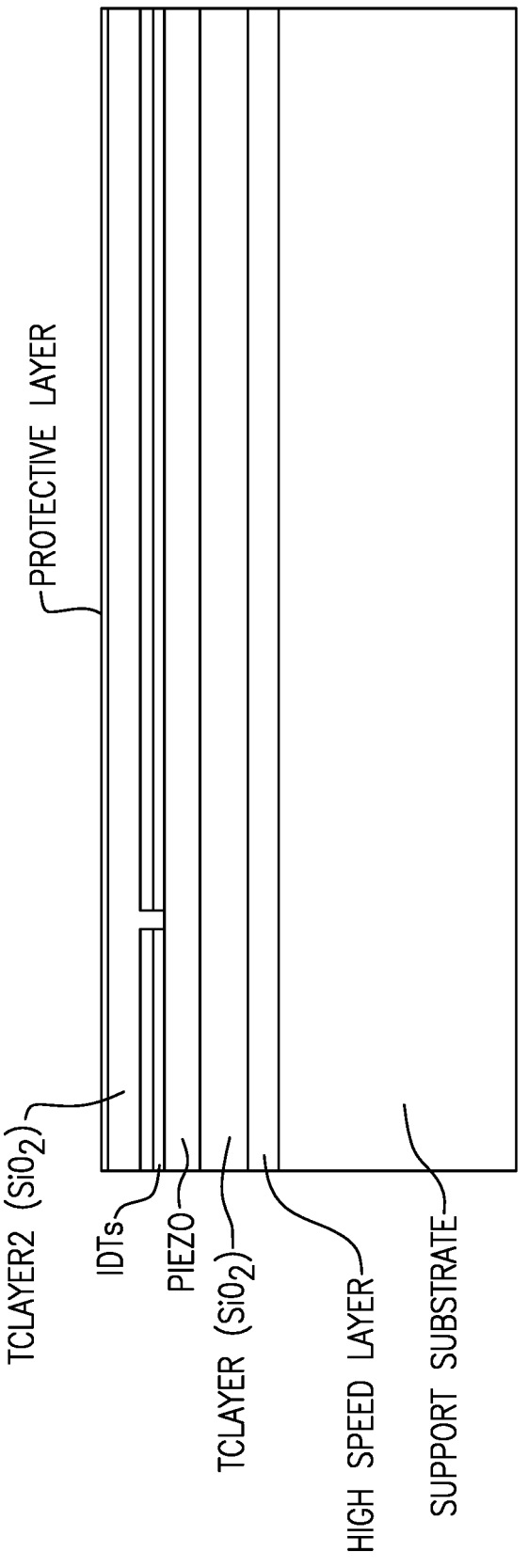
FIG. 10C illustrates an alternative substrate structure that may be included in MPS resonators disclosed herein.

In some embodiments, the MPS SAW resonators may include substrates with a different multi-layer structure than illustrated in the previously described figures. For example, as illustrated in FIG. 10A, a MPS SAW resonator may include a MPS having a layer of a material exhibiting a higher acoustic velocity than the material (e.g., $SiO_2$) of the temperature compensation layer. This additional layer of material is indicated as the "High speed layer" in FIG. 10A. The high speed layer may be formed of, for example, SiN or SiON. In some embodiments, as illustrated in FIG. 10B, a MPS SAW resonator may include a MPS having a second temperature compensation layer ("TC Layer2" in FIG. 10B) disposed on top of the IDT electrodes and layer of piezoelectric material in addition to the temperature compensation layer disposed between the support substrate and the layer of piezoelectric material. The second temperature compensation layer may be formed of the same material, e.g., $SiO_2$, as the temperature compensation layer disposed between the support substrate and the layer of piezoelectric material. In a further embodiment, as illustrated in FIG. 10C, a MPS SAW resonator may include both a high speed layer as illustrated in FIG. 10A and a second temperature compensation layer as illustrated in FIG. 10B. The MPS s of any of FIGS. 10A-10C may be utilized in any of the MPS SAW resonators disclosed herein.

Figure 11A:
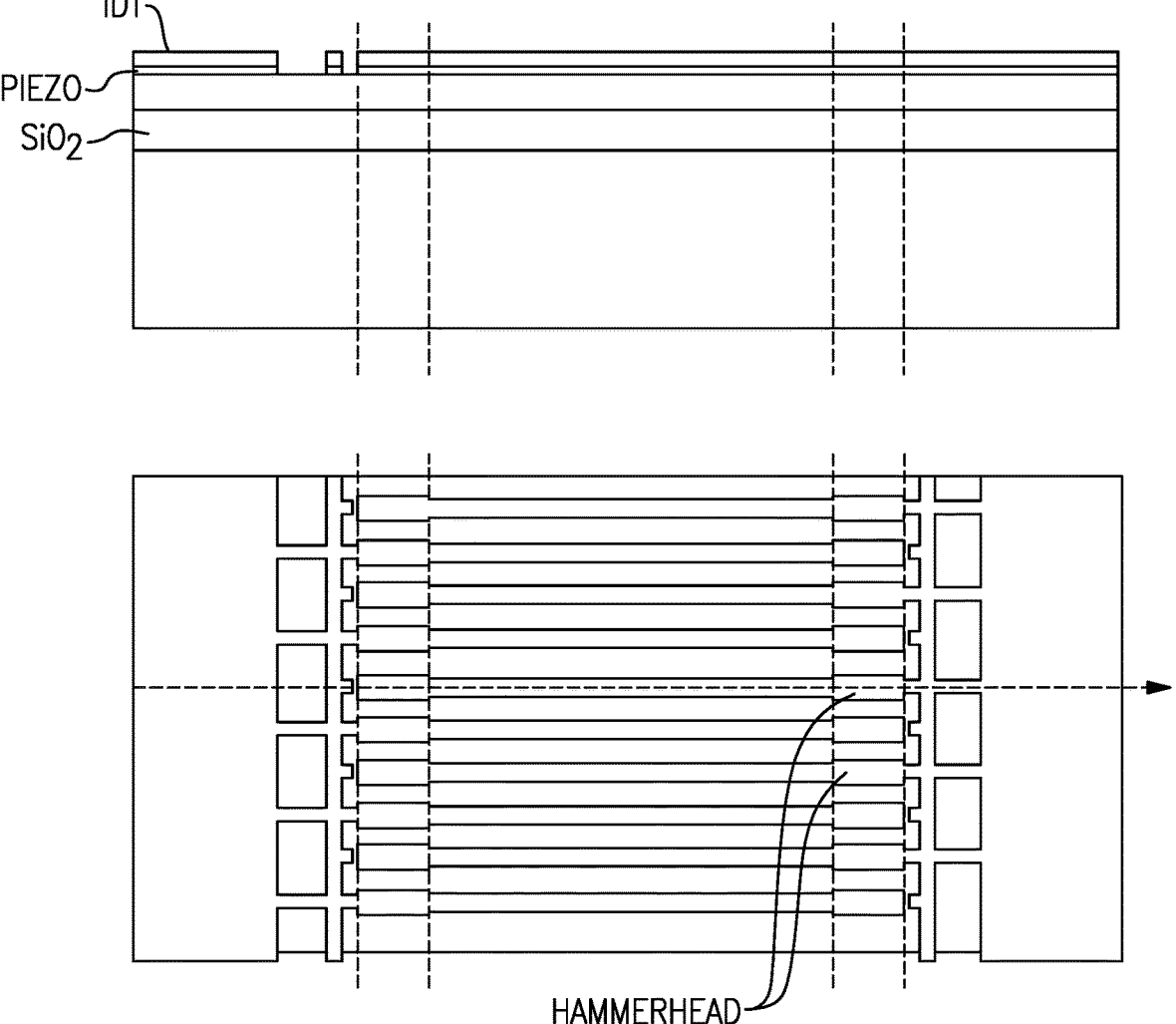
FIG. 11A illustrates a cross-section and plan view of a portion of an MPS resonator including a feature for suppressing transverse acoustic waves.
Figure 11B:
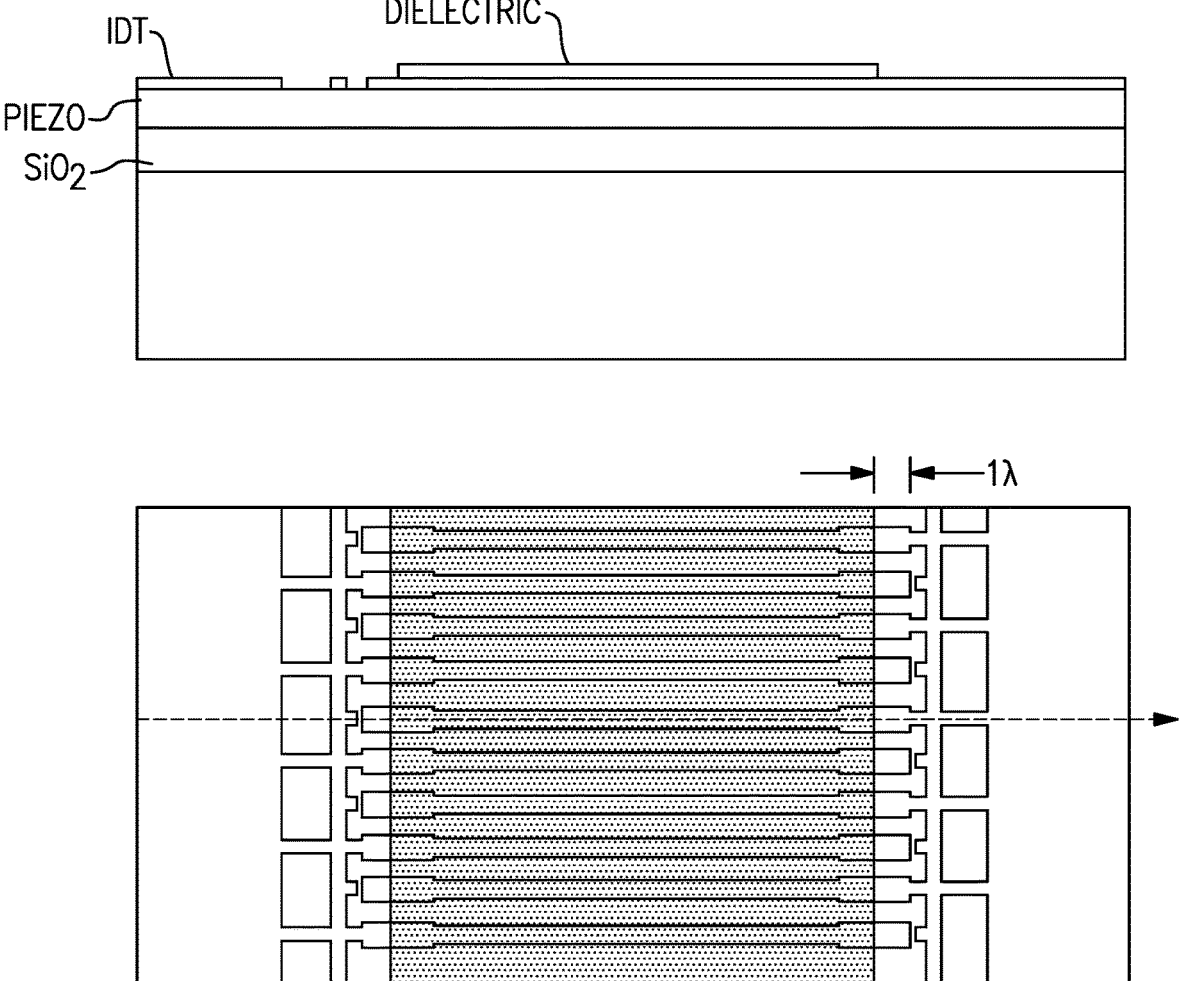
FIG. 11B illustrates a cross-section and plan view of a portion of an MPS resonator including another feature for suppressing transverse acoustic waves.
Figure 11C:
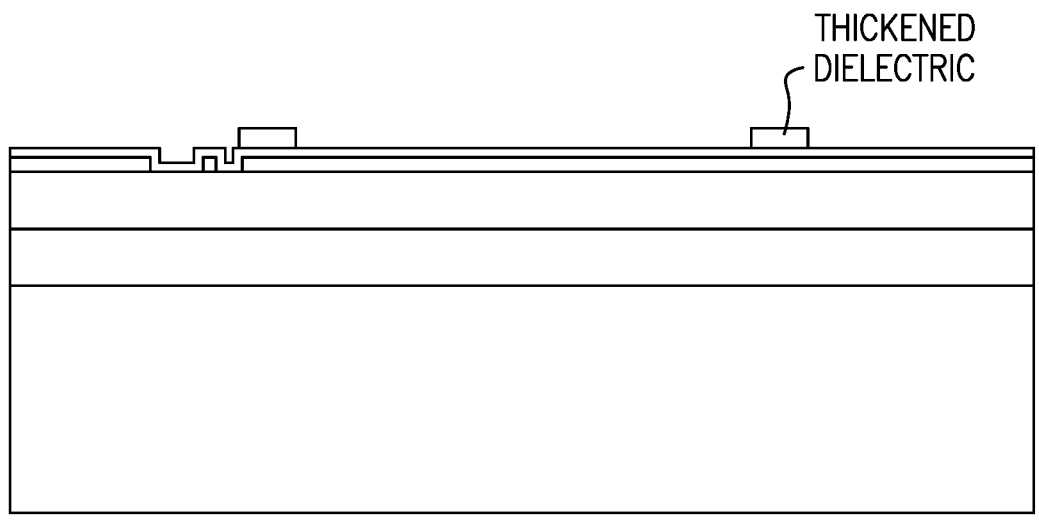
FIG. 11C illustrates a cross-section and plan view of a portion of an MPS resonator including another feature for suppressing transverse acoustic waves.
Figure 11C:
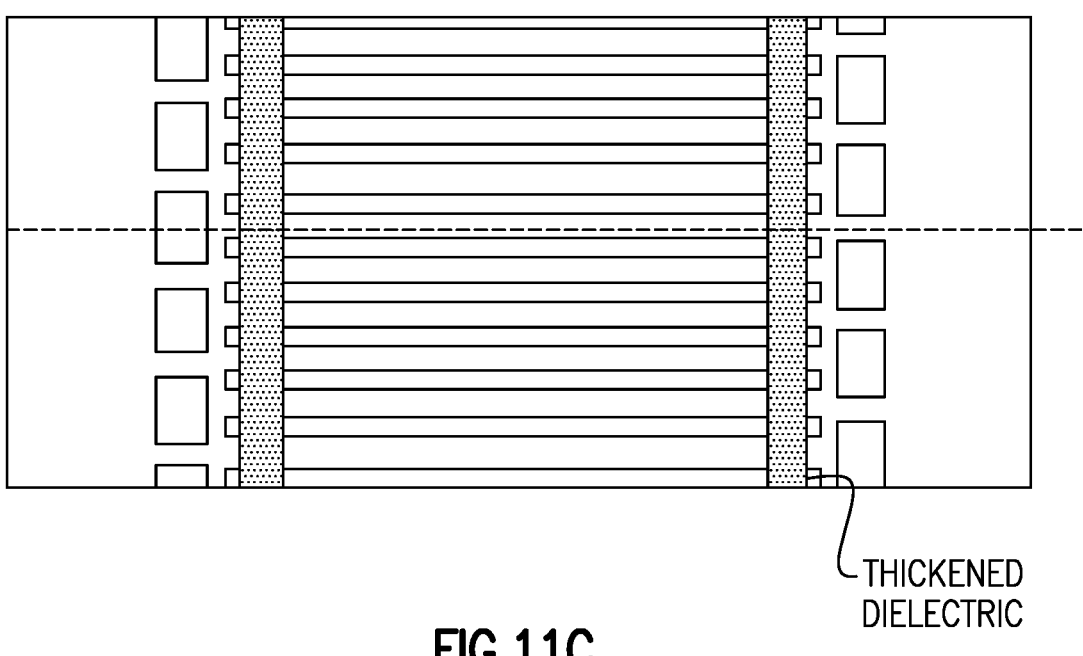
Figure 11D:
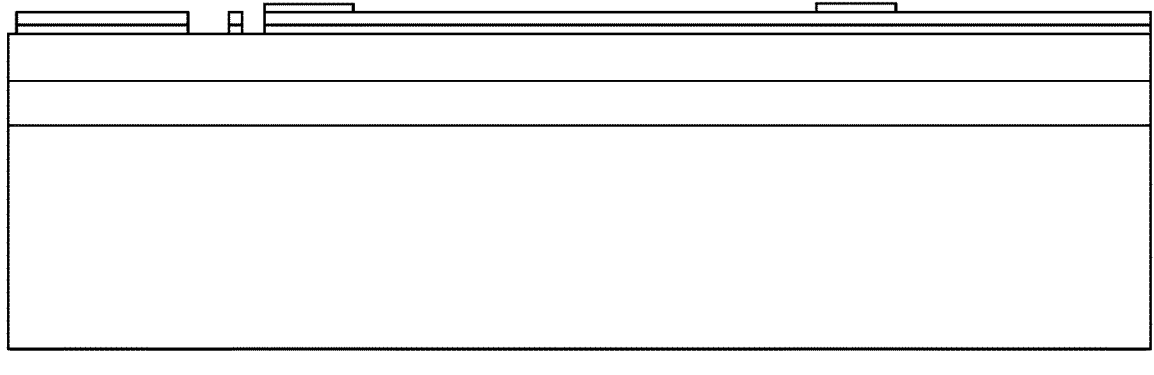
FIG. 11D illustrates a cross-section and plan view of a portion of an MPS resonator including another feature for suppressing transverse acoustic waves.
Figure 11D:
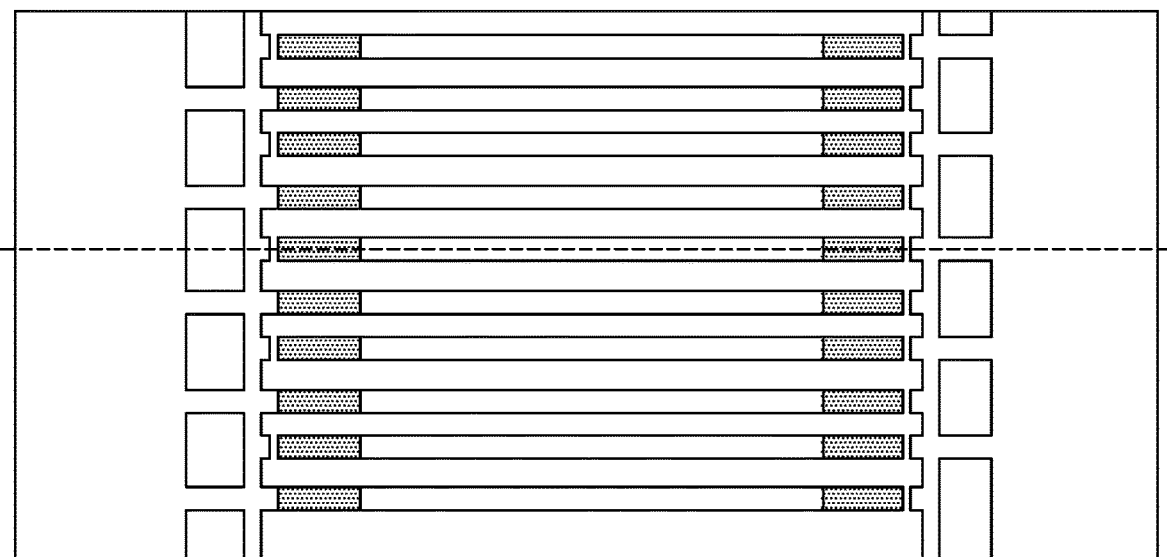
Figure 11E:
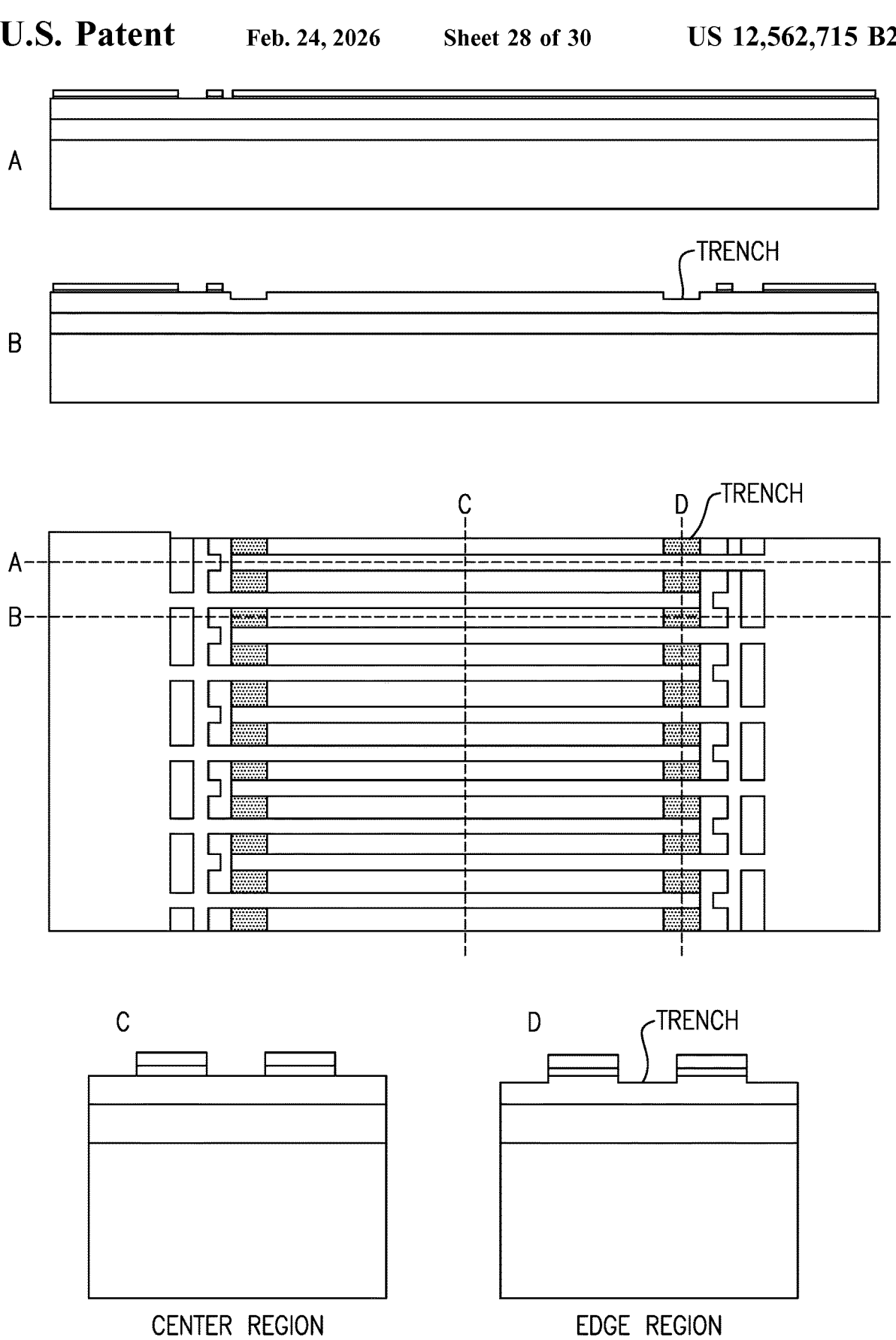
FIG. 11E illustrates a cross-section and plan view of a portion of an MPS resonator including another feature for suppressing transverse acoustic waves.

The IDT electrodes and/or film structure in MPS SAW resonators (single mode SAW or DMS) may include various features to suppress unwanted transverse acoustic wave modes. Some examples of such features are illustrated in cross-sectional and plan views in FIGS. 11A-1E. FIG. 11A illustrates that portions of the IDT electrode fingers (and optionally the reflector electrodes) within edge regions of IDT electrodes may be widened or provided with a greater duty factor than other regions of the IDT electrode fingers, forming hammerhead structures similar to the hammerhead structure of the TCSAW resonator illustrated in FIG. 8B. FIG. 11B illustrates that a layer of dielectric material (SiN or SiON) may be formed over the central active region of the IDT electrodes similar to the thickened region of the protective or passivation layer of the TCSAW resonator illustrated in FIG. 8A. In some embodiments the thickened region of the layer of dielectric material does not cover the tips of the IDT electrode fingers and leaves a length of about $1\lambda$ of the IDT electrode fingers uncovered, where $\lambda$ is the wavelength of the main acoustic wave generated by the resonator. FIG. 11C illustrates that a thickened layer of dielectric material, for example, thickened regions of the protective layer may be formed over the IDT electrodes in the edge regions. FIG. 11D illustrates that edge regions of the IDT electrodes may be thickened, for example, by deposition of an additional or thicker metal layer in the tip regions, similar to how the edge regions of the IDT electrodes may be thickened in the TCSAW resonator of FIG. 8F. FIG. 11E illustrates that trenches may be formed in the layer of piezoelectric material in edge regions of the resonator between the IDT electrode fingers. Any of the features illustrated in FIGS. 11A-11E may be combined with one another in any desired combination to facilitate suppression of transverse mode acoustic waves in an MPS SAW resonator as disclosed herein.

Figure 12:
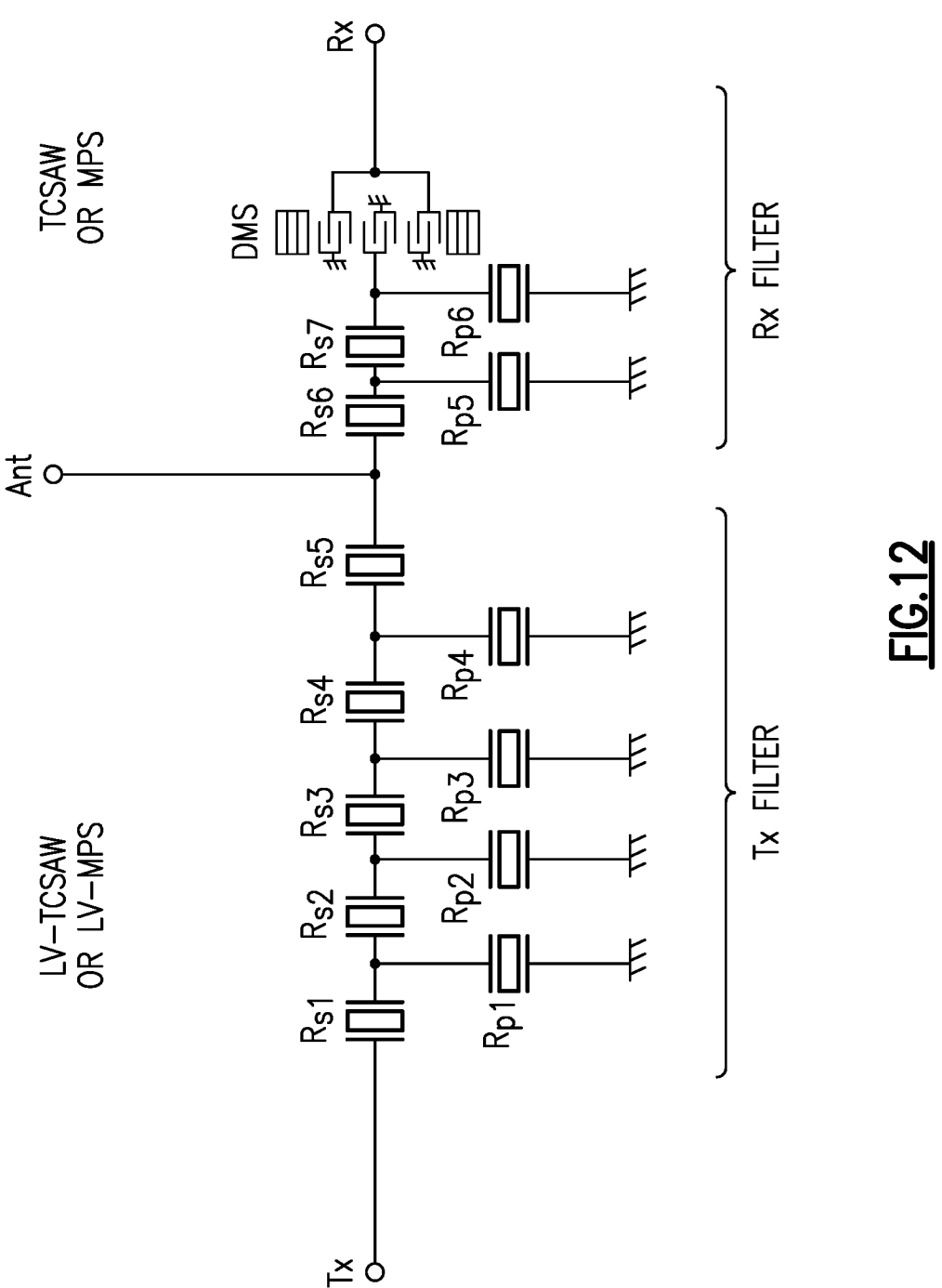
FIG. 12 illustrates the topology of a duplexer including SAW resonators as disclosed herein.

Embodiments of SAW resonators as disclosed herein may be combined into a duplexer. The topology of an example of such a duplexer is illustrated in FIG. 12. The duplexer includes a transmit side port (Tx) for connection to transmission circuitry, a receive side port (Rx) for connection to receiver circuitry, and an antenna port (Ant). A transmission side filter (Tx Filter) is disposed between the Tx and Ant ports. A receive side filter (Rx Filter) is disposed between the Rx and Ant ports. The Tx filter includes series resonators $R_{s1}$-$R_{s5}$ electrically coupled in series between the Tx and Ant ports and shunt resonators $R_{p1}$-$R_{p4}$ electrically coupled between nodes between adjacent ones of the series resonators and ground. The Rx filter includes series resonators $R_{s6}$ and $R_{s7}$ and a DMS resonator electrically coupled in series between the Ant and Rx ports, shunt resonator $R_{p5}$ electrically connected between a node between series resonators $R_{s6}$ and $R_{s7}$ and ground and shunt resonator $R_{p6}$ electrically coupled between a node between series resonator $R_{s7}$ and the DMS resonator and ground. Each of the resonators $R_{s1}$-$R_{s7}$ and $R_{p1}$-$R_{p6}$ may be either LV-TCSAW resonators or LV-MPS resonators including IDT electrodes with an upper high density metal layer as discussed above. The DMS resonator is a regular velocity SAW or MPS resonator including IDT electrodes without the upper high density metal layer. Each of the resonators $R_{s1}$-$R_{s7}$ and $R_{p1}$-$R_{p6}$ and the DMS resonator may be formed on the same die. In other embodiments, any one or more of resonators $R_{s1}$-$R_{s4}$, $R_{s7}$, or $R_{p1}$-$R_{p6}$ not directly adjacent the Ant port may be high velocity SAW or MPS resonators including IDT electrodes with the upper high density metal layer.

In alternate embodiments, the Tx Filter or Rx Filter of FIG. 12 may include a greater or fewer number of series and/or shunt resonators than illustrated.

Embodiments of the disclosed duplexer can be used in a wide variety of electronic devices, such as RF front-end modules and communication devices.

Figure 13:
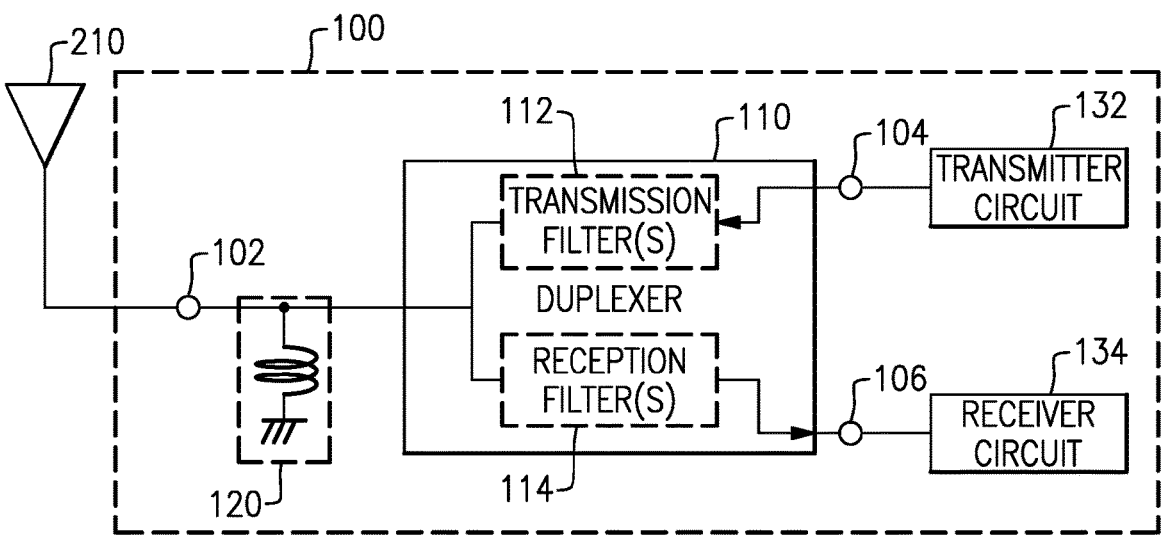
FIG. 13 is a block diagram of one example of a front-end module that can include one or more duplexers according to aspects of the present disclosure.

Referring to FIG. 13, there is illustrated a block diagram of one example of a front-end module 100, which may be used in an electronic device such as a wireless communications device (e.g., a mobile phone) for example. The front-end module 100 includes an antenna duplexer 110 having a common node 102, an input node 104, and an output node 106. An antenna 210 is connected to the common node 102. The antenna duplexer may be a duplexer such as illustrated in FIG. 12.

The antenna duplexer 110 may include one or more transmission filters 112 connected between the input node 104 and the common node 102, and one or more reception filters 114 connected between the common node 102 and the output node 106. The passband(s) of the transmission filter(s) are different from the passband(s) of the reception filters. Examples of the SAW and/or BAW filters disclosed herein can be used to form the transmission filter(s) 112 and/or the reception filter(s) 114. An inductor or other matching component 120 may be connected at the common node 102.

The front-end module 100 further includes a transmitter circuit 132 connected to the input node 104 of the duplexer 110 and a receiver circuit 134 connected to the output node 106 of the duplexer 110. The transmitter circuit 132 can generate signals for transmission via the antenna 210, and the receiver circuit 134 can receive and process signals received via the antenna 210. In some embodiments, the receiver and transmitter circuits are implemented as separate components, as shown in FIG. 13, however, in other embodiments these components may be integrated into a common transceiver circuit or module. As will be appreciated by those skilled in the art, the front-end module 100 may include other components that are not illustrated in FIG. 13 including, but not limited to, switches, electromagnetic couplers, amplifiers, processors, and the like.

Figure 14:
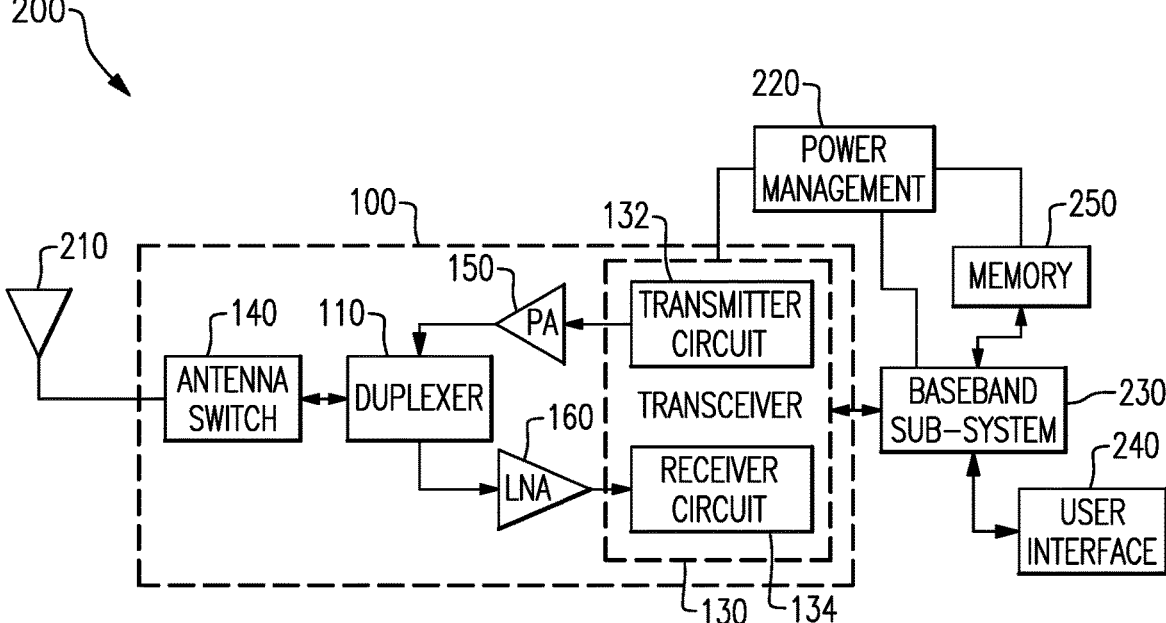
FIG. 14 is a block diagram of one example of a wireless device including the front-end module of FIG. 13.

FIG. 14 is a block diagram of one example of a wireless device 200 including the antenna duplexer 110 shown in FIG. 13. The wireless device 200 can be a cellular phone, smart phone, tablet, modem, communication network or any other portable or non-portable device configured for voice or data communication. The wireless device 200 can receive and transmit signals from the antenna 210. The wireless device includes an embodiment of a front-end module 100 similar to that discussed above with reference to FIG. 13. The front-end module 100 includes the duplexer 110, as discussed above. In the example shown in FIG. 7 the front-end module 100 further includes an antenna switch 140, which can be configured to switch between different frequency bands or modes, such as transmit and receive modes, for example. In the example illustrated in FIG. 14, the antenna switch 140 is positioned between the duplexer 110 and the antenna 210; however, in other examples the duplexer 110 can be positioned between the antenna switch 140 and the antenna 210. In other examples the antenna switch 140 and the duplexer 110 can be integrated into a single component.

The front-end module 100 includes a transceiver 130 that is configured to generate signals for transmission or to process received signals. The transceiver 130 can include the transmitter circuit 132, which can be connected to the input node 104 of the duplexer 110, and the receiver circuit 134, which can be connected to the output node 106 of the duplexer 110, as shown in the example of FIG. 14.

Signals generated for transmission by the transmitter circuit 132 are received by a power amplifier (PA) module 150, which amplifies the generated signals from the transceiver 130. The power amplifier module 150 can include one or more power amplifiers. The power amplifier module 150 can be used to amplify a wide variety of RF or other frequency-band transmission signals. For example, the power amplifier module 150 can receive an enable signal that can be used to pulse the output of the power amplifier to aid in transmitting a wireless local area network (WLAN) signal or any other suitable pulsed signal. The power amplifier module 150 can be configured to amplify any of a variety of types of signal, including, for example, a Global System for Mobile (GSM) signal, a code division multiple access (CDMA) signal, a W-CDMA signal, a Long-Term Evolution (LTE) signal, or an EDGE signal. In certain embodiments, the power amplifier module 150 and associated components including switches and the like can be fabricated on gallium arsenide (GaAs) substrates using, for example, high-electron mobility transistors (pHEMT) or insulated-gate bipolar transistors (BiFET), or on a Silicon substrate using complementary metal-oxide semiconductor (CMOS) field effect transistors.

Still referring to FIG. 14, the front-end module 100 may further include a low noise amplifier module 160, which amplifies received signals from the antenna 210 and provides the amplified signals to the receiver circuit 134 of the transceiver 130.

The wireless device 200 of FIG. 14 further includes a power management sub-system 220 that is connected to the transceiver 130 and manages the power for the operation of the wireless device 200. The power management system 220 can also control the operation of a baseband sub-system 230 and various other components of the wireless device 200. The power management system 220 can include, or can be connected to, a battery (not shown) that supplies power for the various components of the wireless device 200. The power management system 220 can further include one or more processors or controllers that can control the transmission of signals, for example. In one embodiment, the baseband sub-system 230 is connected to a user interface 240 to facilitate various input and output of voice and/or data provided to and received from the user. The baseband sub-system 230 can also be connected to memory 250 that is configured to store data and/or instructions to facilitate the operation of the wireless device, and/or to provide storage of information for the user. Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a range from about 30 kHz to 5 GHz, such as in a range from about 600 MHz to 2.7 GHz.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A radio frequency multiplexer comprising:
a piezoelectric substrate;
a first surface acoustic wave resonator including interdigital transducer electrodes disposed on the piezoelectric substrate, the interdigital transducer electrodes of the first surface acoustic wave resonator having a first metal layer formed of a first metal and a second metal layer disposed on the first metal layer and formed of a second metal having a higher density than the first metal; and
a second surface acoustic wave resonator including interdigital transducer electrodes disposed on the piezoelectric substrate, the interdigital transducer electrodes of the second surface acoustic wave resonator having the first metal layer formed of the first metal, but lacking the second metal layer, the first surface acoustic wave resonator being a single mode resonator, the second surface acoustic wave resonator being a multi-mode resonator.

2. The multiplexer of claim 1 wherein the interdigital transducer electrodes of the first and second surface acoustic wave resonators further include another metal layer formed of a third metal having a density higher than the first metal and disposed on the piezoelectric substrate beneath the first metal layer.

3. The multiplexer of claim 2 wherein the first and second surface acoustic wave resonators are temperature compensated acoustic wave resonators including a layer of silicon dioxide covering the interdigital transducer electrodes of the first and second surface acoustic wave resonators and regions of the piezoelectric substrate not covered by the interdigital transducer electrodes of the first and second surface acoustic wave resonators.

4. A radio frequency device module including the multiplexer of claim 1.

5. A radio frequency device including the radio frequency device module of claim 4.

6. The multiplexer of claim 1 wherein the second surface acoustic wave resonator is a double mode resonator.

7. The multiplexer of claim 1 further comprising an antenna port and a third resonator, the third resonator being disposed electrically between the antenna port and the second surface acoustic wave resonator.

8. The multiplexer of claim 7 further comprising a receive side filter, the second surface acoustic wave resonator being included in the receive side filter.

9. The multiplexer of claim 1 wherein the piezoelectric substrate is a multilayer piezoelectric substrate including a support substrate, a layer of dielectric material disposed on the support substrate, and a layer of piezoelectric material disposed on the layer of dielectric material.

10. The multiplexer of claim 9 wherein the multilayer piezoelectric substrate further comprises a layer of silicon dioxide covering the interdigital transducer electrodes of the first and second surface acoustic wave resonators and regions of the piezoelectric substrate not covered by the interdigital transducer electrodes of the first and second surface acoustic wave resonators.

11. The multiplexer of claim 10 wherein the multilayer piezoelectric substrate further comprises a layer of a material having a higher acoustic velocity than that of the layer of piezoelectric material disposed between an upper surface of the support substrate and a lower surface of the layer of dielectric material.

12. The multiplexer of claim 9 wherein the interdigital transducer electrodes of the first and second surface acoustic wave resonators further include another metal layer disposed on the piezoelectric substrate beneath the first metal layer, the another metal layer being formed of a third metal having a density higher than the first metal and having a thickness less than a thickness of the first metal layer.

13. The multiplexer of claim 12 wherein the second metal layer and another metal layer are formed of a same metal.

14. The multiplexer of claim 9 wherein an entirety of the interdigital transducer electrodes of the first surface acoustic wave resonator includes the second metal layer.

15. The multiplexer of claim 9 wherein busbar electrodes and regions of electrode fingers in a gap region of the first surface acoustic wave resonator include the first metal layer but are free of the second metal layer.

16. The multiplexer of claim 9 wherein reflector electrodes of the first surface acoustic wave resonator include the first and second metal layers.

17. The multiplexer of claim 9 wherein reflector electrodes of the first surface acoustic wave resonator include the first metal layer but are free of the second metal layer.

18. The multiplexer of claim 1, configured as a duplexer.

* * * * *